United States Patent [19]

Litwin

[11] Patent Number: 5,659,190

[45] Date of Patent: Aug. 19, 1997

[54] SEMICONDUCTOR DEVICE IN A THIN ACTIVE LAYER WITH HIGH BREAKDOWN VOLTAGE

[75] Inventor: Andrej Litwin, Danderyd, Sweden

[73] Assignee: Telefonaktiebolaget LM Ericsson, Stockholm, Sweden

[21] Appl. No.: 669,848

[22] Filed: Jun. 26, 1996

Related U.S. Application Data

[63] Continuation of Ser. No. 303,622, Sep. 9, 1994, abandoned, which is a continuation-in-part of Ser. No. 185,004, Jan. 24, 1994, abandoned.

[51] Int. Cl.$^6$ .................... H01L 29/80; H01L 27/01; H01L 29/76; H01L 27/082
[52] U.S. Cl. .................... 257/273; 257/347; 257/378; 257/577
[58] Field of Search .................... 257/273, 577, 257/347, 352, 500, 501, 378, 339, 565, 169, 336, 334, 492, 272, 134

[56] References Cited

U.S. PATENT DOCUMENTS

| | | | |
|---|---|---|---|
| 3,404,295 | 10/1968 | Warner, Jr. ................... | 257/565 |
| 4,292,642 | 9/1981 | Appels et al. ................. | 257/169 |
| 4,300,150 | 11/1981 | Colak ........................... | 257/336 |
| 4,409,606 | 10/1983 | Wagenaar et al. ............ | 257/334 |
| 4,422,089 | 12/1983 | Vaes et al. .................... | 257/492 |
| 4,485,392 | 11/1984 | Singer ........................... | 257/272 |
| 4,587,545 | 5/1986 | Berthold et al. .............. | 257/134 |
| 4,587,656 | 5/1986 | Hartman et al. .............. | 257/134 |
| 4,605,948 | 8/1986 | Martinelli ...................... | 257/492 |
| 4,608,590 | 8/1986 | Hartman et al. .............. | 257/134 |
| 4,639,761 | 1/1987 | Singer et al. .................. | 257/378 |
| 4,868,624 | 9/1989 | Grung et al. .................. | 257/273 |

FOREIGN PATENT DOCUMENTS

| | | | |
|---|---|---|---|
| 086 010 | 8/1983 | European Pat. Off. .......... | 257/169 |
| 391 056 | 10/1990 | European Pat. Off. .......... | 257/347 |
| 418 737 | 3/1991 | European Pat. Off. .......... | 257/347 |
| 0513764 | 11/1992 | European Pat. Off. .......... | 257/339 |

OTHER PUBLICATIONS

J. A. Appels et al., "High Voltage Thin Layer Devices (Resurf Devices)" *IEEE, Proceedings from IEDM*, pp. 238–241 (1979).
J. A. Appels et al., "Thin Layer High–Voltage Devices (Resurf Devices)" *Philip J. Res.*, vol. 35, No. 1, pp. 1–13 (1980).
H. W. Becke, "Approaches to Isolation in High Voltage Integrated Circuits (Invited Paper)", *IEEE, Proceedings from IEDM*, pp. 724–727 (1985).
M. F. Chang et al., "Advanced 1200v HVIC Technology" *IEEE, Proceedings from IEDM*, pp. 230–233 (1986).
A. Litwin et al., "Extremely Compact CMOS Compatible Bipolar Silicon–On–Insulator Transistor for Mixed High Voltage and High Density Integrated Circuit Applications," 23rd European Solid State Devise Research Conference, Grenoble, France (Sep. 13–16, 1993).
A. W. Ludikhuize, "A Versatile 700–1200–V IC Process for Analog and Switching Applications", *IEEE Transactions on Electron Devices*, vol. 38, No. 7, pp. 1582–1589 (Jul. 1991).
S. M. Sze, *Physics of Semiconductor Devices*, Second Edition, John Wiley & Sons, pp. 312–324 (1981).

*Primary Examiner*—Steven H. Loke
*Attorney, Agent, or Firm*—Burns, Doane, Swecker & Mathis, L.L.P.

[57] ABSTRACT

A silicon substrate carries an isolating silicon dioxide layer and a relatively weakly and negatively doped monocrystalline silicon wafer. A component region is delimited in the wafer by an isolating layer. A bipolar transistor in the component region has a positively doped base region which includes a heavily and positively doped base connection and a heavily and negatively doped emitter. The transistor has a PN–junction at the underside of the base region and is series connected with a field effect transistor having a heavily and negatively doped drain connection. The component region is weakly doped and the distance from the PN–junction to the silicon dioxide layer is small so that a region will be readily depleted of charge carriers when applying voltages to the transistors. The voltages produce an electric field of low electrical field strength in the depleted region. This counteracts the breakthrough of a current between the base and the drain connection. The transistors withstand high voltages and require only half the space on the substrate required by corresponding earlier known transistors.

5 Claims, 15 Drawing Sheets

SECTION A-A

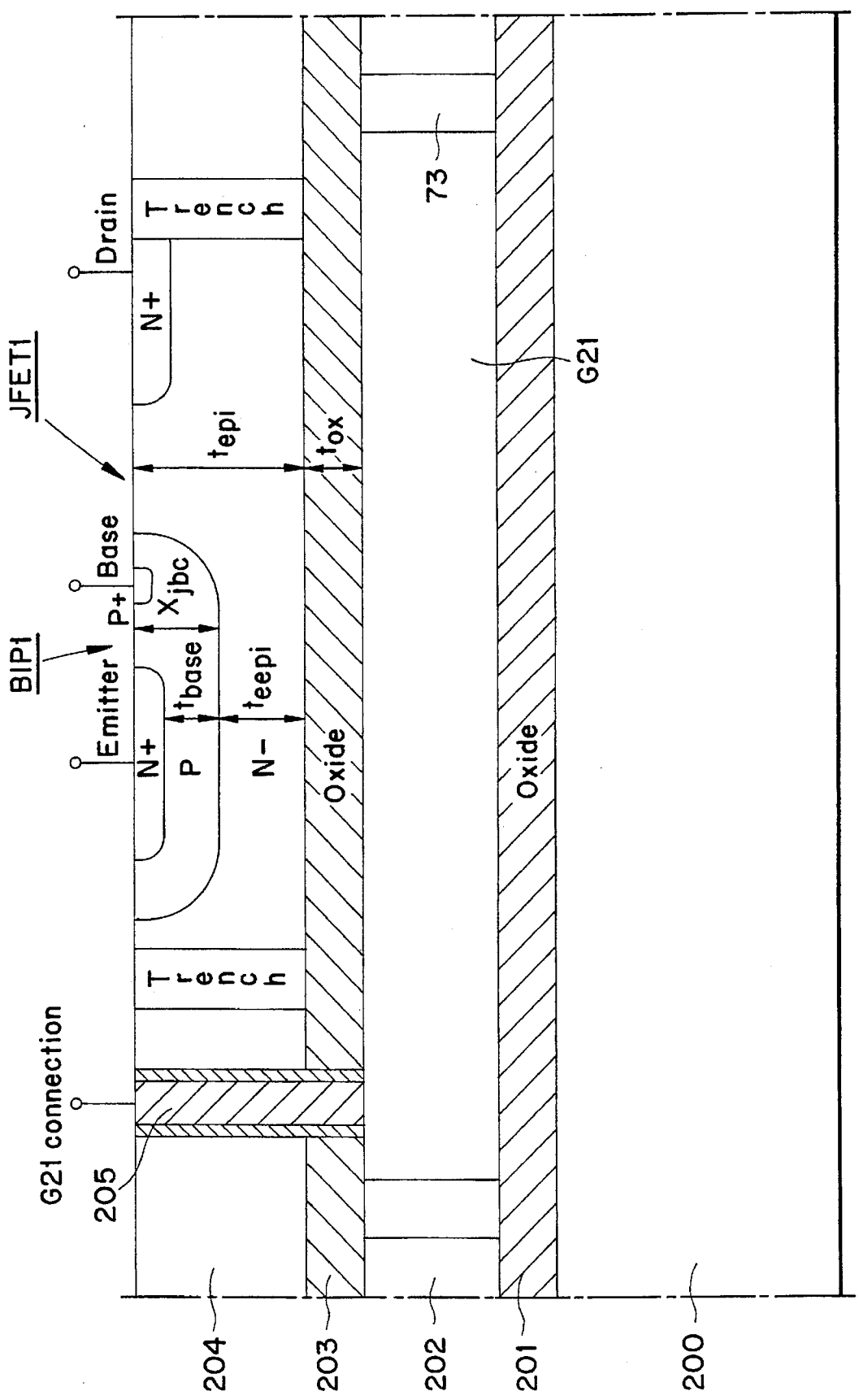

SEMICONDUCTOR DEVICE IN A THIN ACTIVE LAYER WITH HIGH BREAKDOWN VOLTAGE

This application is a continuation of application Ser. No. 08/303,622, filed Sep. 9, 1994, now abandoned, which is a continuation-in-part of U.S. patent application Ser. No. 08/185,004, filed on Jan. 24, 1994, now abandoned.

FIELD OF THE INVENTION

The present invention relates to a semiconductor device in a thin active layer with high breakdown voltage, wherein the device has charge carrier depleted regions of reduced electrical field strength.

BACKGROUND OF THE INVENTION

Semiconductor circuits are required to withstand a relatively high voltage in many different kinds of applications. An example of one such application is found in the subscriber line circuits of telephone exchanges. In older Swedish telephone exchanges, the line to a subscriber was required to have an applied voltage of 48 volts, and modern subscriber line circuits in semiconductor techniques are adapted to these voltages. Higher voltages are required in other countries, for instance 68 volts in Germany, while other applications of semiconductor circuits may use still higher voltages, for instance voltages of 400 volts or more.

One problem with these relatively high voltages is that the electrical field strength may exceed the critical field strength of the semiconductor material in certain regions of a component. This can result in a current breakthrough which destroys the semiconductor material if the current is not limited. The same problem of high field strength also occurs in very small and fast semiconductor components intended for calculating or computing circuits. Although these components are connected to low voltages, on the order of 3 to 5 volts, the small extensions of the components enable the electrical field strength to reach high values.

In certain applications, the problem of high electric field strength is pronounced at the surface of a semiconductor component, as described in an article in IEEE, Proceedings from IEDN, 1979, pages 238–241, by J. A. Appels and H. M. J. Vaes: "High Voltage Thin Layer Devices (Resurf Devices)", this article being hereby incorporated by reference in the present description. The semiconductor component has a surface layer in which there is included a PN-junction in which the critical field strength of the material is reached at a given applied voltage. The surface layer is weakly doped on one side of the PN-junction and this weakly doped part can be depleted of charge carriers by making the surface layer relatively thin. The applied voltage is distributed over a long distance along the component surface, so that the maximum field strength will adopt a value beneath the breakdown field strength. The phenomenon is well known within semiconductor technology and has been given the personal acronym RESURF (REduced SURface Field). The resurf technique is described in more detail in an article in Philips J. Res. 35, 1–13, 1980, J. A. Appels, et al: "Thin Layer High-Voltage Devices". This article is also hereby incorporated by reference in the present description.

U.S. Pat. No. 4,409,606 describes the resurf technique applied to a transistor. A relatively thin semiconductor layer in which the transistor is formed is mounted on a semiconductor substrate. The substrate and the layer form a PN-junction and a heavily doped region in the PN-junction is arranged beneath one transistor connection. This junction is reverse biased and the thin semiconductor layer is depleted of charge carriers up to the layer surface, along a path which extends between the heavily doped region and the second transistor connection. A good degree of safety against current breakthrough is obtained when this path is made sufficiently long. Such application of the resurf technology deals with those problems that occur with breakdown voltage at the base of a bipolar transistor due to current amplification, often referred to as common base amplification and designated $\alpha_o$ in the literature. A similar arrangement is also described in U.S. Pat. No. 4,639,761.

European Patent Application No. A1-0,086,010 describes a transistor which is similar to the transistor described in the two aforesaid U.S. patents. This latter transistor, however, lacks the heavily doped region in the PN-junction, and the layer in which the transistor is formed has an elevated doping concentration. It is therefore difficult to fully deplete this layer of charge carriers and an isolated electrode is placed over those regions to be depleted of charge carriers in order to achieve total depletion.

In the case of the two aforesaid U.S. patents and the European patent application, the transistor is connected to the semiconductor substrate of the device through the aforesaid PN-junction. The transistor is delimited laterally by deep, heavily doped regions which have reverse biased PN-junctions. one drawback with the thus delimited transistors is that they take up a large amount of space in the substrate. This drawback is avoided with an arrangement according to European Patent Application No. A1-0,418,737, which describes transistors on a common substrate that are dielectrically isolated from one another. A surface of a semiconductor substrate is oxidized to form an isolating layer on which a relatively thin wafer of epitaxial semiconductor material is mounted. This epitaxial wafer has etched therein grooves which extend down to the isolating layer. The side surfaces of the grooves are oxidized and the grooves filled with polycrystalline semiconductive material. Components are formed in the dielectrically isolated, box-like regions thus formed. These components have an external connection which is connected to a heavily doped connecting layer beneath respective components on the box bottom, in direct abutment with the isolating oxide layer.

European Patent Application No. A2-0,391,056 describes an alternative method of forming a semiconductor substrate with dielectrically isolated regions. The isolated regions are produced by repeatedly etching the substrate and coating with semiconductor material. The dielectric isolation is comprised of oxidized semiconductor material. The regions have a weakly doped area in which the actual component is formed and a heavily doped connection layer which is located beneath said component and lies against the dielectrically isolating layer.

U.S. Pat. No. 4,868,624 discloses a monolithic semiconductor transistor structure wherein the active collector region of a bipolar-junction transistor is physically and operatively merged with the channel region of a junction field-effect transistor, providing a composite circuit which approximates a cascode configuration. By controlling the integral of the net impurity doping concentration to various active regions of the device, the active collector region of a bipolar-junction transistor configuration is made sufficiently thin so as to simultaneously function as an active collector region as well as a channel region of one or more field-effect transistors.

U.S. Pat. Nos. 4,587,545, 4,587,656 and 4,608,590 teach high voltage semiconductor switches. The switches are gate-provided diodes which are formed in a dielectrically isolated region of relatively weakly doped semiconductor material. An anode and a cathode are diffused into the surface of the isolated region and the electrical connection therebetween can be broken with the aid of a gate in the surface of said region. The anode and the cathode have a type of doping which is opposite to the type of doping of the isolated region. The regions around the anode and the cathode can be depleted of charge carriers in accordance with the resurf technique, by applying appropriate voltages to the switch, which thereby becomes highly resistive in its cut-off state.

SUMMARY OF THE DISCLOSURE

The present invention pertains to an application of the known resurf technique in an electrically delimited component region for a class of components that differ from earlier disclosed classes of components in corresponding delimited regions. More specifically, the present invention includes a bipolar transistor connected in series with a field effect transistor. This transistor arrangement is formed in a component region which has a dielectrically isolated layer at its bottom surface. The bipolar transistor has a base region which extends downwardly from the upper surface of the component region. A PN-junction junction between the base region and the component region delimits said base region and can be reverse biased so that a region between the base region and the dielectrically isolating layer is depleted of charge carriers. This depletion occurs at a collector voltage of some few volts and can be readily achieved because the component region is relatively weakly doped and because the depleted region beneath the base region is significantly much thinner than in the case of known bipolar transistors. Despite the thinness of this region beneath the base region, the transistor device is able to withstand high voltages due to the fact that the voltage is taken-up laterally by the component region beneath the charge carrier depleted base region. The transistor device has a series resistance which is normal for bipolar transistors, which is unexpected in view of the fact that the device lacks a highly doped collector region beneath the base region. The characteristics of the transistor device are also in good accord with corresponding earlier known characteristics. The inventive transistor device is significantly thinner than corresponding known devices and takes up a much smaller area on its semiconductor substrate than these earlier known devices.

According to another embodiment of the present invention, the present invention includes a bipolar transistor connected in series with a field effect transistor and an isolated gate field effect transistor connected in parallel to the field effect transistor and in a cascade configuration with the bipolar transistor. By applying the proper voltage to the gate field effect transistor, the electric properties of the cascode device can be widely varied.

BRIEF DESCRIPTION OF THE DRAWINGS

The invention will now be described in more detail with reference to exemplifying embodiments thereof and also with reference to the accompanying drawings, in which:

FIG. 19($b$) illustrates an expanded section of FIG. 19($a$);

FIG. 24 illustrates a cross-sectional view of transistors according to another embodiment of the present invention.

DETAILED DESCRIPTION OF THE DISCLOSURE

Figure 1:
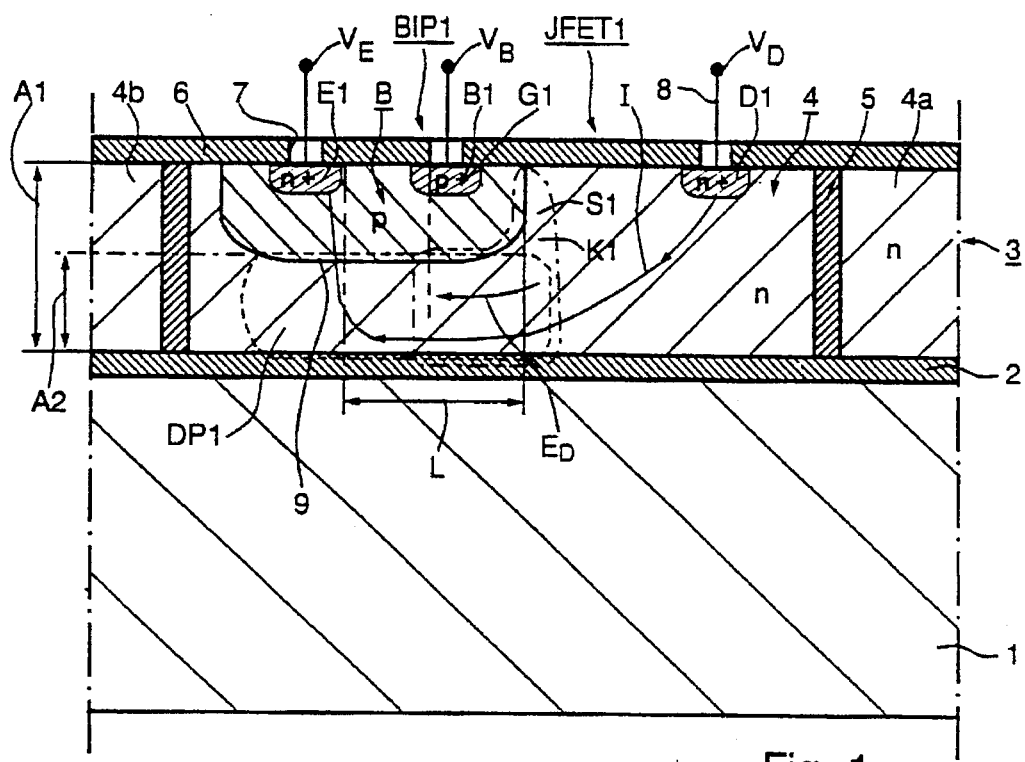
FIG. 1 is a cross-sectional view of a bipolar transistor and a field effect transistor.

FIG. 1 is a cross-sectional view of an inventive bipolar NPN transistor BIP1 which is connected in series to a field effect transistor JFET1. A semiconductor substrate 1, in this case a silicon substrate, has an upper surface which is oxidized to form an electrically isolating silicon-dioxide layer 2. A relatively thin wafer 3 of monocrystalline silicon is mounted on the upper layer 2, this wafer being the active layer of the transistor device BIP1 and JFET1. The active layer has a relatively low concentration of negative charge carriers, referenced n in the Figure. The monocrystalline wafer 3 has a thickness A1 which in the case of the illustrated embodiment is equal to 4 μm. A component region 4 is delimited against surrounding parts 4$a$ and 4$b$ in the wafer 3, by means of a separation layer 5 comprised of silicon dioxide and polycrystalline silicon. The separation layer 5 extends from the surface of the monocrystalline wafer 3 down to the isolating layer 2 and fully surrounds the transistors BIP1 and JFET1. The component region 4 is thereby totally isolated electrically from the substrate 1 and the surrounding parts 4$a$ and 4$b$ of the monocrystalline wafer 3.

The transistor BIP1 has a base region B which is doped with positive charge carriers referenced p in the Figure. The base B has a connection region B1 for coaction with an external electrical connection, this connection region being heavily doped $p^+$ with positive charge carriers. The base region B of the transistor BIP1 includes an emitter E1 which is heavily doped $n^+$ with negative charge carriers. A collector region K1 of the transistor BIP1 is also located in the component region 4. A gate connection G1 of the transistor JFET1 is common with the base connection B1 and a source region S1 of said transistor is common with the collector region K1 of the transistor BIP1. A heavily $n^+$ doped region D1 forms the drain connection of the transistor JFET1.

The component region 4 is covered by a silicon-dioxide isolating layer 6, which is provided with openings 7 for external electrical connections 8. These connections are connected to respective connection regions B1 of the base, the emitter E1 and the drain region D1. The configuration of such external electrical connections is well known and the connections have not been shown in detail in FIG. 1, so as not to complicate the Figure unnecessarily.

Figure 3:
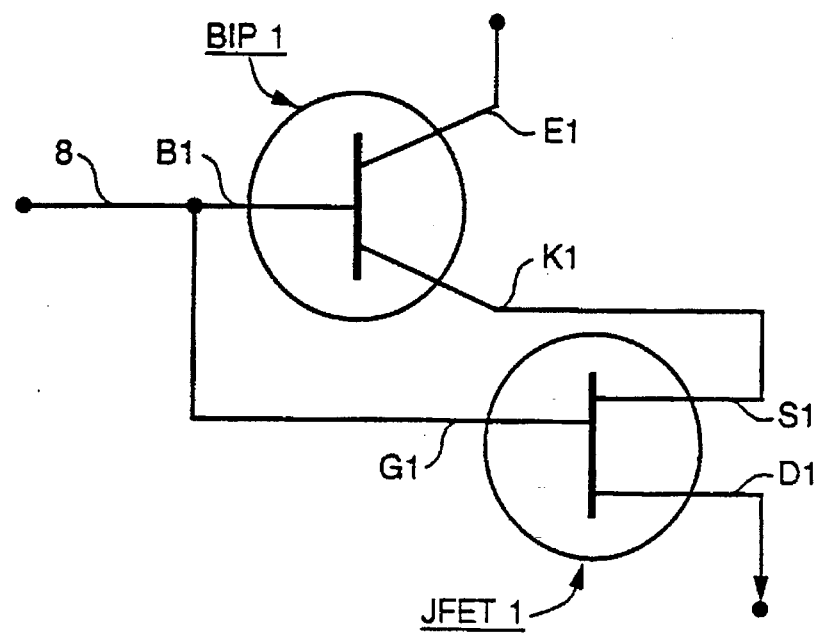
FIG. 3 is a schematic illustration of the transistors in FIGS. 1 and 2.

FIG. 3 is a schematic illustration of the series-connected transistors BIP1 and JFET1. The base connection B1 is connected to the gate connection G1 and the collector K1 is connected to the source region S1. Each of the base connection B1, the emitter E1 and the drain connection D1 has one of the external connections 8.

In a typical operational case, the transistors BIP1 and JFET1 are connected to the following voltages:

Drain voltage $V_D = +70$ V

Emitter voltage $V_E = 0$ V (earth)

Base and gate voltage $V_B = 0.6$ V

The transistor BIP1 has a PN-junction 9 at the bottom surface of the base region B which is reverse biased and depleted of charge carriers in a typical manner through the voltages applied. In accordance with the invention, a region DP1 between the PN-junction 9 and the isolating layer 2 is relatively weakly doped and also has a relatively small thickness $A2 = 2$ µm. The entire region DP1 is therefore depleted of charge carriers and a large part of the electric voltage between the base region B and the drain region D1 is distributed over a relatively long path L. As a result, an electric field strength $E_D$ in the depletion region DP1 assumes a low value, all in accordance with the resurf technique as presented in the two aforesaid references "High Voltage Thin Layer Devices" by J. A. Appels and H. M. J. Vaes, and "Thin Layer High-Voltage Devices" by J. A. Appels, et al. The field strength in the region DP1 can be kept beneath the critical field strength $E_{CR}$ of the silicon, which is about $3-10^5$ V/cm, preventing a surge of current I in this region.

It should be carefully noted that the entire region DP1 in the inventive transistor BIP1, right down to the isolating layer 2, is comprised of weakly doped material which is easily depleted of charge carriers. Many known transistors include a highly doped layer placed beneath the base region of the transistor, a so-called buried layer, in distinction to the aforesaid, and there is a long distance between the PN-junction of the base region and this highly doped layer, so that the known transistor is able to withstand high voltages. A corresponding highly doped layer would completely destroy the resurf effect in the inventive transistor device BIP1 and JFET1 in FIG. 1. A highly doped layer is difficult to deplete of charge carriers and the electrical field strength of such a contemplated layer would reach the breakdown field strength $E_{CR}$ at a relatively low voltage between the drain region D1 and the emitter E1. The region D1 is depleted of charge carriers at a drain voltage $V_D$ of only some few volts.

Figure 2:
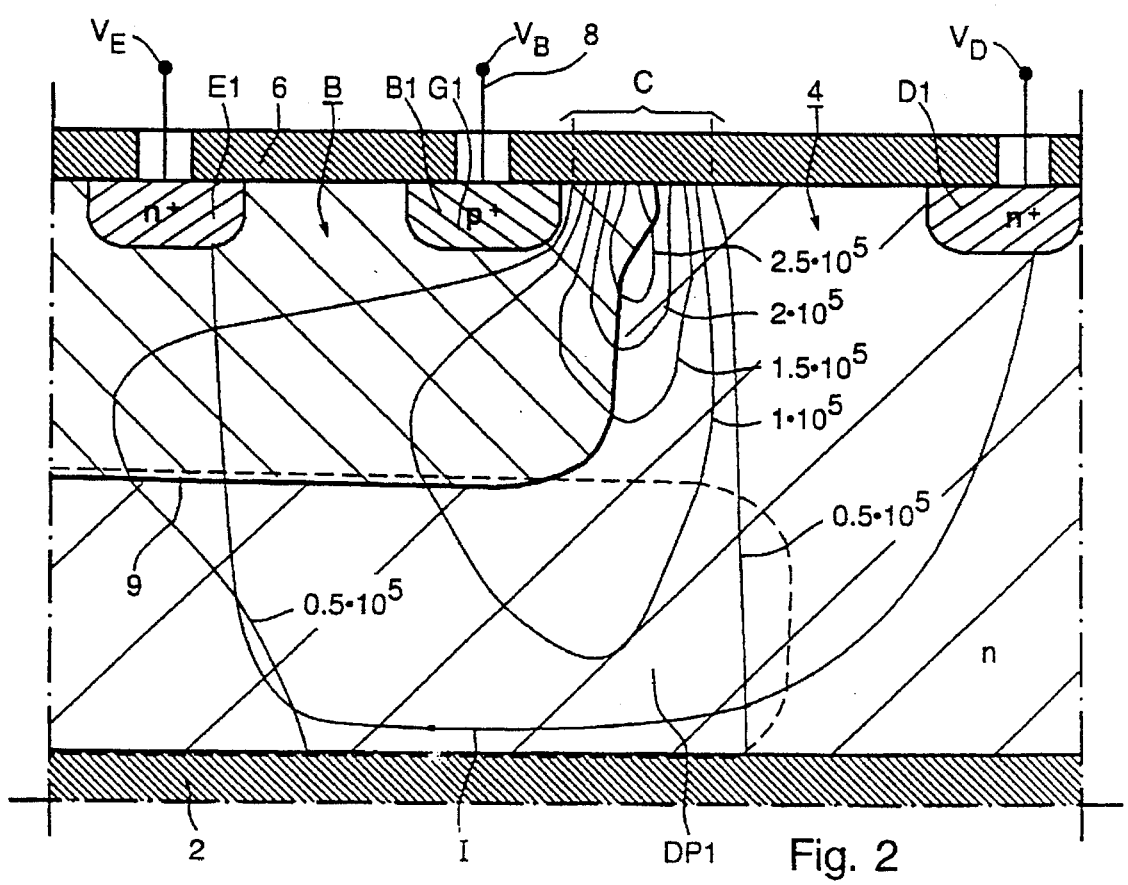
FIG. 2 is a cross-sectional view showing field lines of the transistors illustrated in FIG. 1.

FIG. 2 illustrates an enlarged part of FIG. 1. The Figure illustrates the isolating layer 2, part of the component region 4, part of the base region B with the connection region B1 and G1 and the emitter E1, the drain region D1 and a part of the depleted region DP1. FIG. 2 also includes a family of curves C related to the electrical field $E_D$. The curve family includes curves identified by digits $0.5-10^5$, $1-10^5$ . . . $2.5-10^5$ and the electrical field strength along a curve has a constant value. This value is given by the digit sign for respective curves and has been given in the unit volt/cm, so that, for instance, the field strength along the curve farthest to the left in the Figure has the value $0.5-10^5$ V/cm. The field strengths appear when the component is connected to the aforesaid operational voltages. The curve family C is based on an arithmetic model which experience has shown to produce very precise values. It will be seen that the electrical field strength in the depletion region DP1 is low, so as to prevent surging of the current I. It will also be seen that the electrical field $E_D$ has a relatively high field strength at the surface of the component region 4, in the vicinity of the isolating layer 6. At normal voltages of the transistors BIP1 and JFET1, practically no current will flow in this part of the component region 4 and neither will current surges occur. However, the relatively high field strength limits the voltages that can be applied to the transistor device BIP1 and JFET1.

In the case of the FIG. 1 embodiment, the component region 4 is surrounded by the separation layer 5, which is dielectrically isolating. In the case of an alternative embodiment, the separation layer is comprised of a heavily and positively $p^+$-doped region which surrounds the component region 4 and extends from the surface of the monocrystalline layer 3 down to the dielectrically isolating layer 2. The separation layer has a PN-junction to which a reversed voltage is applied so as to delimit the component region 4 electrically against the surrounding parts 4a and 4b.

Figure 4:
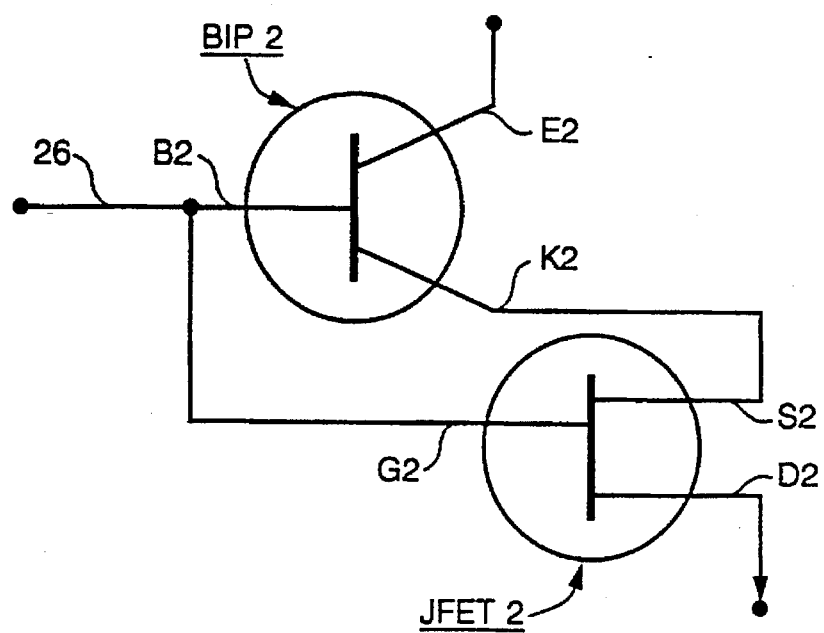
FIG. 4 is a schematic illustration of two series-connected transistors.

An alternative embodiment of the invention will now be described with reference to FIG. 4, FIG. 5 and FIG. 6. FIG. 4 illustrates schematically a bipolar transistor BIP2 which is connected in series to a field effect transistor JFET2. The transistor BIP2 has an emitter E2 and a base B2 which is connected to a gate G2 of the field effect transistor JFET2. This transistor has a drain connection D2 and also a source connection S2, which is connected to a collector K2 of the transistor BIP2.

Figure 5:
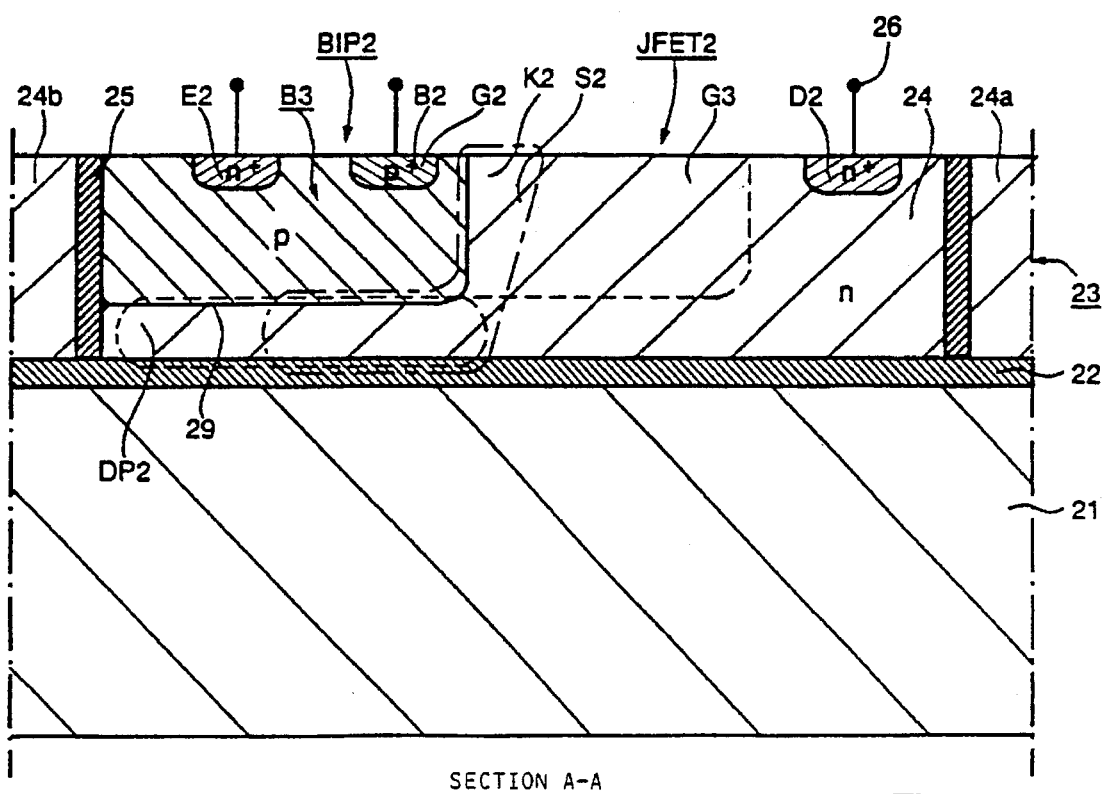
FIG. 5 is a cross-sectional view of the transistors in FIG. 4.

FIG. 5 is a cross-sectional view of one embodiment of the transistors BIP2 and JFET2. The cross-section is taken on the line A—A in FIG. 6. The upper surface of a silicon substrate 21 is oxidized to form an isolating layer 22, and a weakly n-doped monocrystalline wafer 23 is mounted on the layer 22. The wafer 23 has a thickness of 4 µm, similar to the earlier embodiment. A component region 24 is delimited in the monocrystalline wafer 23 by a separation layer 25 which surrounds the component region 24. The separation layer is comprised of trenches in the mono-crystalline wafer 23, the sides of which are oxidized to form electrically insulating layers and the remainder of the trenches is filled with polycrystalline silicon. The component region 24 is thereby isolated electrically from surrounding parts 24a and 24b of the monocrystalline wafer 23. The bipolar transistor BIP2 and the field effect transistor JFET2 are arranged in the component region 24. In order not to complicate the Figure unnecessarily, protective surface layers with openings for external connections 26 have not been shown in the Figure. The connections 26 are only shown schematically.

The transistor BIP2 has a base region B3 which is positively p-doped relatively weakly and has a heavily positively p⁺-doped connection region B2. The emitter E2 of the transistor BIP2 is located in the base region B3 and is heavily n⁺-doped. The base region B3 extends from the upper surface of the component region 24 down to a PN-junction 29 at the underside of the base region B3. Located between the PN-Junction 29 and the isolating layer 22 is a region DP2 which is uninfluenced by the doping of the base region. The collector region K2 of the transistor BIP2 is located on one side of the base region B3, as shown in the Figure, by a chain line. With the embodiment of the invention illustrated in FIG. 5, high electric field strengths are avoided in the whole of the collector region K2, as will be described in more detail herebelow.

The gate connection G2 of the transistor JFET2 is common with the base connection B2. The active gate itself is comprised of two p-doped regions G3 which project out from the base region B3 in the form of bifurcate projections which extend along the sides of the separation layer 25. The configuration of the gate region is shown more clearly in FIG. 6. which illustrates the transistors BI2P2 and JFET2 from above. FIG. 5 illustrates the gate region G3 in broken lines. The case of the illustrated embodiment, the bifurcate projections G3 extend down into the component region 24 to the same depth as the base region B3, but may extend right down to the isolating layer 22. The source region S2 of the transistor JFET2 is common with the collector region K2 of the transistor BIP2. The drain connection D2 of the transistor JFET2 is comprised of a heavily and negatively n⁺-doped region.

Figure 6:
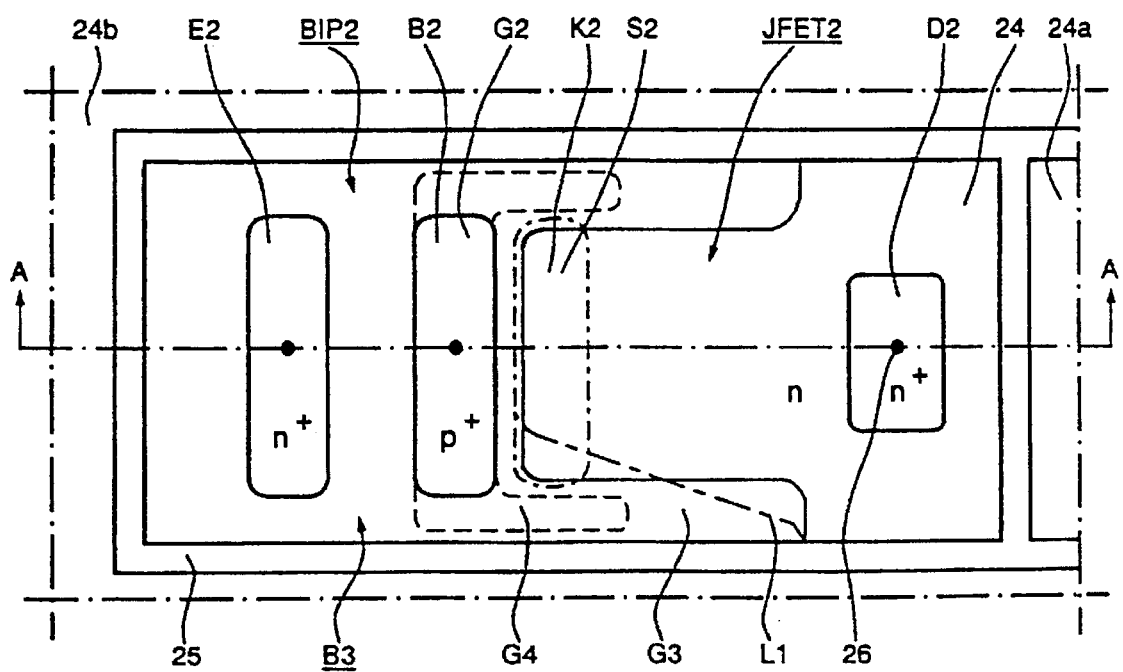
FIG. 6 is a view the transistors in FIG. 5 from above.

FIG. 6 illustrates the different regions of the transistors BIP2 and JFET2 from above. The component region 24 is completely surrounded by the separation layer 25 and the base region B3 extends transversely across the elongated component region in one end of said region. The base connection B2 and the emitter connection E2 are comprised of elongated regions which extend in the transverse direction of the component region 24. The bifurcate projections G3 projecting from the base region B3, the gate of the transistor JFET2 extend in the longitudinal direction of the component region 24 along the separation layer 25 and along a respective side of the component region. The drain connection D2 is positioned at the other end of the component region. The Figure also illustrates an alternative embodiment of the gate connection G2. Two heavily and positively p⁺-doped bifurcate regions G4 extend in the projections G3, so as to improve the electrical contact with these projections. Although the projections G3 of the illustrated embodiment are shown to have uniform thickness, it will be understood that they may have some other form and may, for instance, be Y-shaped as illustrated by the chain line L1 in the Figure.

Figure 7:
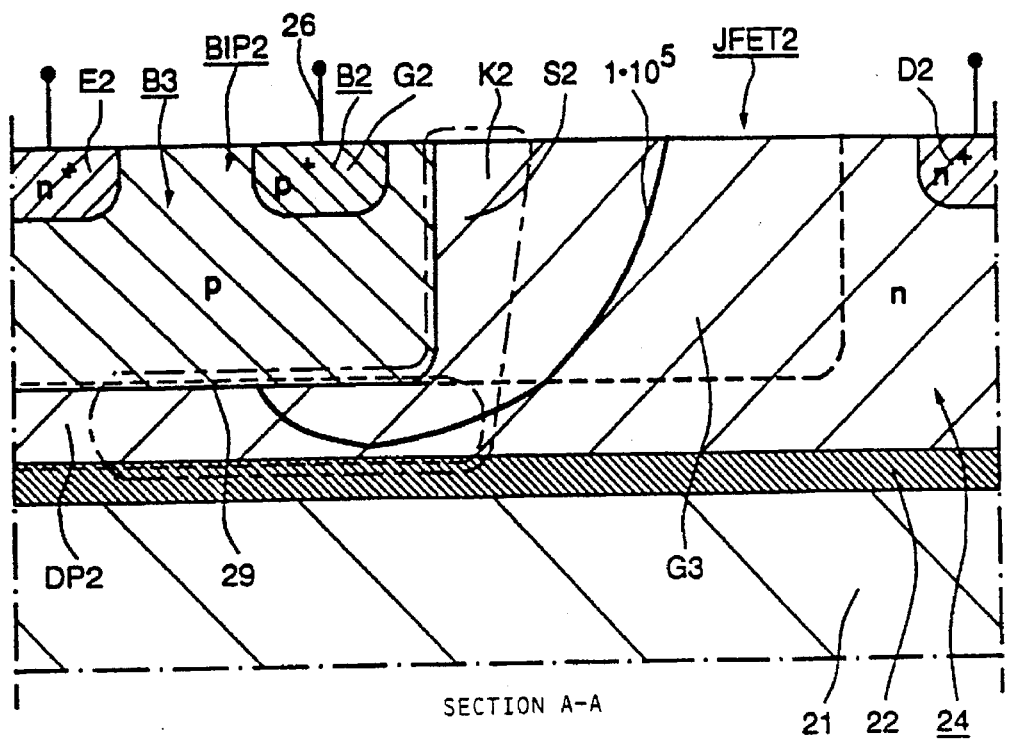
FIG. 7 is a cross-sectional view showing field lines relating to the transistors in FIG. 4.
Figure 8:
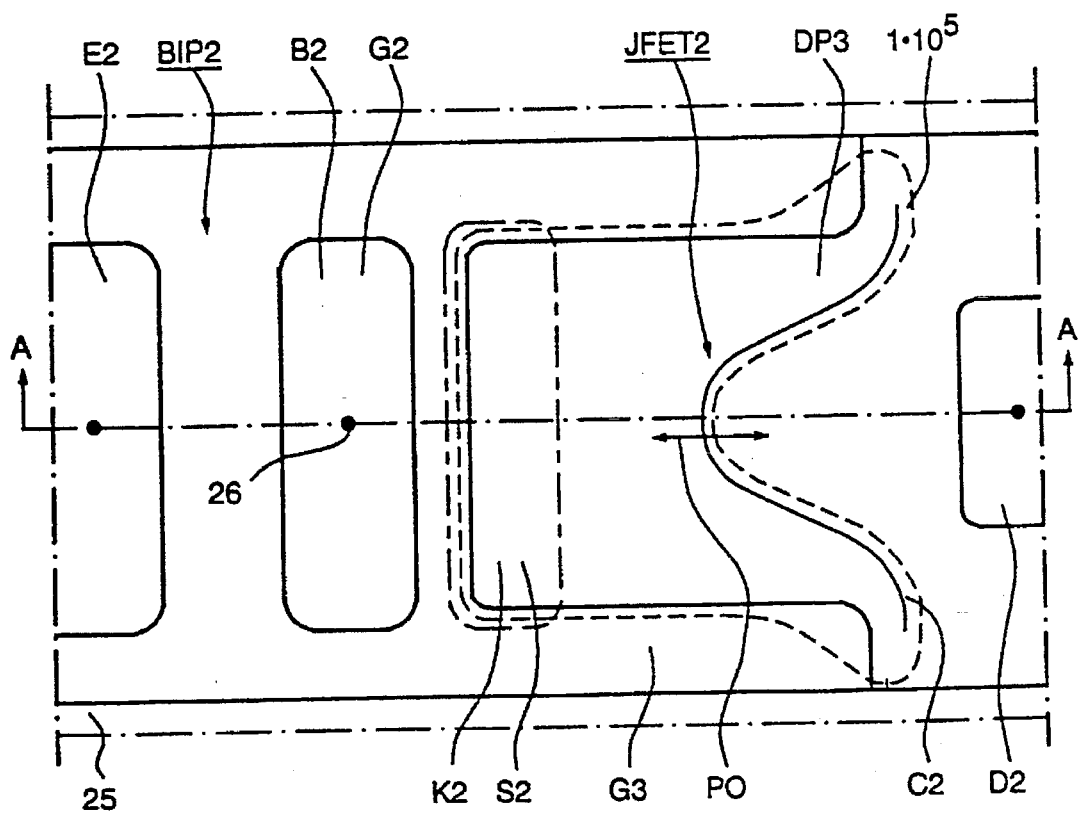
FIG. 8 is a view showing field lines relating to the transistors in FIG. 4, as seen from above.

The electrical field and the depletion regions in the component region 24 will be described briefly with reference to FIG. 7 and FIG. 8. These Figures illustrate parts of FIG. 5 and 6 in larger scale. The region DP2, which is a depletion region, is shown adjacent the PN-junction 29 beneath the base region B3. A corresponding depletion region DP1 of the transistor BIP1 has been described in closer detail with reference to FIGS. 1 and 2. The field effect transistor JFET2 has a depletion region DP3 which extends between the projections G3, as shown by a broken defining line. The defining line of the region DP3 can be displaced by appropriate selection of the voltages applied to the connections 26 of the transistor JFET2. At the line A—A, this displacement takes place in a direction indicated by a double-headed arrow PO. The depletion region DP3 extends partly into the projections G3, as shown in the Figure at the ends of the projections. It should be noted that both gate projections G3 of the field effect transistor JFET2 extend from the surface of the component region 24 downwardly into said region. Similarly, the depletion region DP3 extends downwardly from the surface of the component region. The electrical field strength in the component region is described by a curve C2. A digital value 1– $10^5$ denotes the electrical field strength along the curve in volt/cm that applies to the blocking state of the transistor device when the emitter E2 and the base connection B2 are grounded and the drain connection D2 is connected to a voltage of +100 V. The electrical field strength can be illustrated more accurately with a curve family similar to that illustrated in FIG. 2, although only the curve C2 has been shown in order not to complicate the Figure unnecessarily. It will be seen from FIG. 7 that the field strength is low, both in the depletion region DP2 beneath the transistor BIP2 and between the projections G3. The curve C2 in FIG. 8 discloses the electrical field strength on the surface of the component region 24. The illustrated curve C2 is based on appraisals of the field strength, since it is difficult to take reliable measurements and because a reliable arithmetical model is at present lacking for the embodiment illustrated in FIGS. 5–8.

The relatively high field strength $2.5-10^5$ V/cm at the edge of the base region B in FIG. 2 is avoided in the inventive embodiment illustrated in FIGS. 5 and 6. This means that the series-connected transistors BIP2 and JFET2 provide a component which is able to withstand very high voltages. The alternative embodiment which includes the Y-shaped projections G3 in FIG. 6 improves voltage durability still further, because the ends of these projections can be readily depleted of charge carriers. The series resistance of the transistor device between the source region S2 and the drain connection D2 can be kept low, because the distance between the projections G3 widens successively towards the drain connection.

Figure 9:
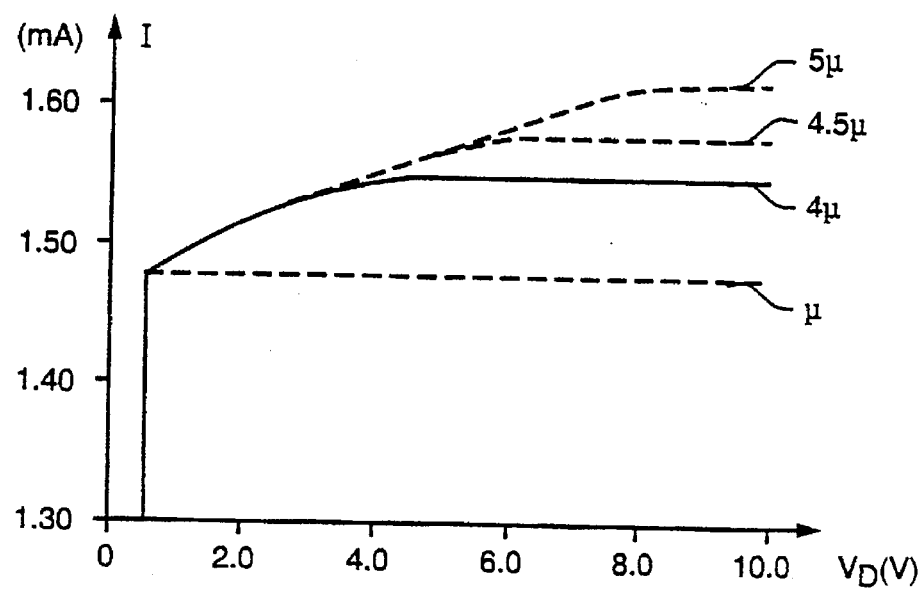
FIG. 9 illustrates a current-voltage characteristic of the transistor device in FIG. 1.

Certain data related to the transistor device BIP1 and JFET1 illustrated in FIGS. 1 and 2 will be explained in more detail with reference to FIGS. 9 and 10 and comparisons with known transistors will also be made. FIG. 9 is a diagram in which the drain voltage $V_D$ in volts is given on the abscissa and a normalized value of the current I expressed in mA is given on the ordinate. A full line curve 4μ discloses the characteristics of the transistor device shown in the Figures, this transistor device being formed in the monocrystalline wafer 3 of thickness A1—4 μm. Broken line curves 4.5μ and 5μ illustrate characteristics of transistor devices formed in monocrystalline wafers of thicknesses 4.5 and 5 μm respectively. A broken line curve μ illustrates a characteristic which is ideal from a signal processing aspect. It will be noted that the thinner the monocrystalline wafer 3, the closer the characteristics of the transistor device approach the desired ideal curve μ.

Figure 10:
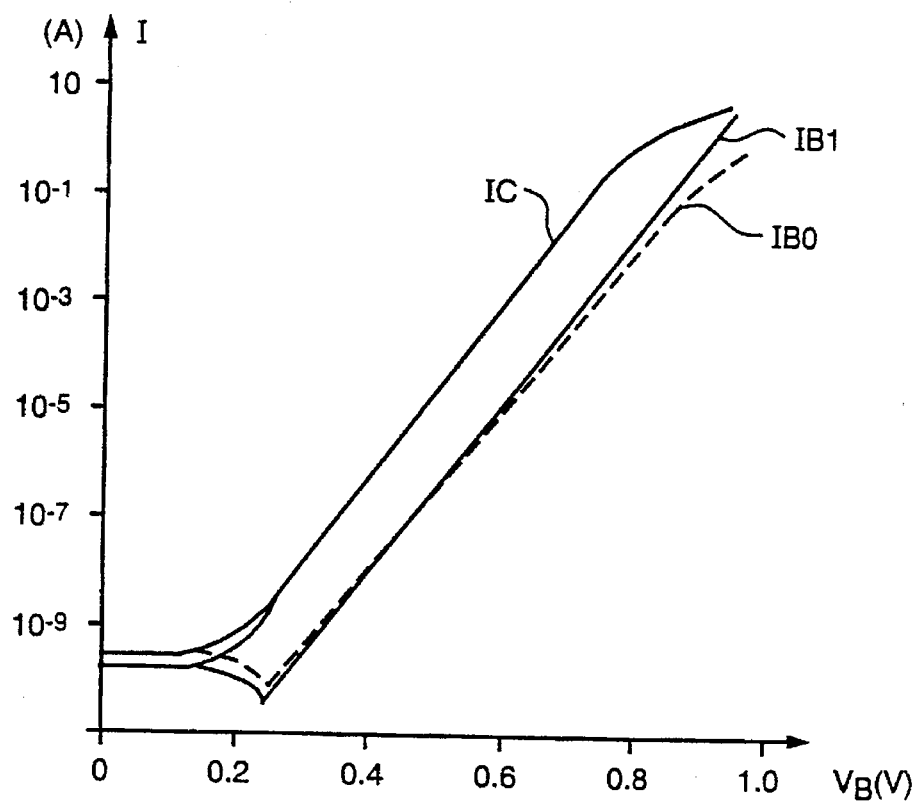
FIG. 10 is a diagram showing comparison curves relating to a known and to an inventive transistor.

FIG. 10 is a diagram in which the voltage $V_B$ in volts is given on the abscissa and a normalized current value in ampere is given on the ordinate. A full line curve IC shows how the aforesaid current I varies with the voltage $V_B$ at a drain voltage $V_D$ set at 7.5 volts. It will be noted that the current curve for a corresponding transistor of earlier known construction is in such good accord with the current curve of the inventive transistor that the two curves can hardly be distinguished from one another in the diagram. A difference which results in the inventive transistor producing a slightly lower current will only occur when voltages $V_B$ lie beneath 0.20 volt. A full line curve IB1 illustrates a base current for the inventive transistor BIP1 and a broken line curve IBO illustrates the base current for the known transistor just mentioned.

As before mentioned, the inventive transistor BIP1 is formed in the wafer 3 of thickness A1=4μ, which shall be compared with the aforesaid known transistor which is formed in a monocrystalline wafer of thickness 25 μm. The known transistor has a heavily doped layer beneath its base region and the distance between this wafer and the base region of the transistor must be sufficiently large in order to prevent current breakthrough. Consequently, the relatively large thickness of the monocrystalline layer is a necessity, although it represents a serious drawback. In the case of present techniques, it is not possible to produce dielectrically isolating separation layers corresponding to the layer 5 in excessively thick mono-crystalline layers. The known transistor is therefore delimited by separation layers comprised of deep and heavily doped diffusions, which are space-demanding. This means that the known transistor will take up large surface areas on its monocrystalline layer.

Figure 11:
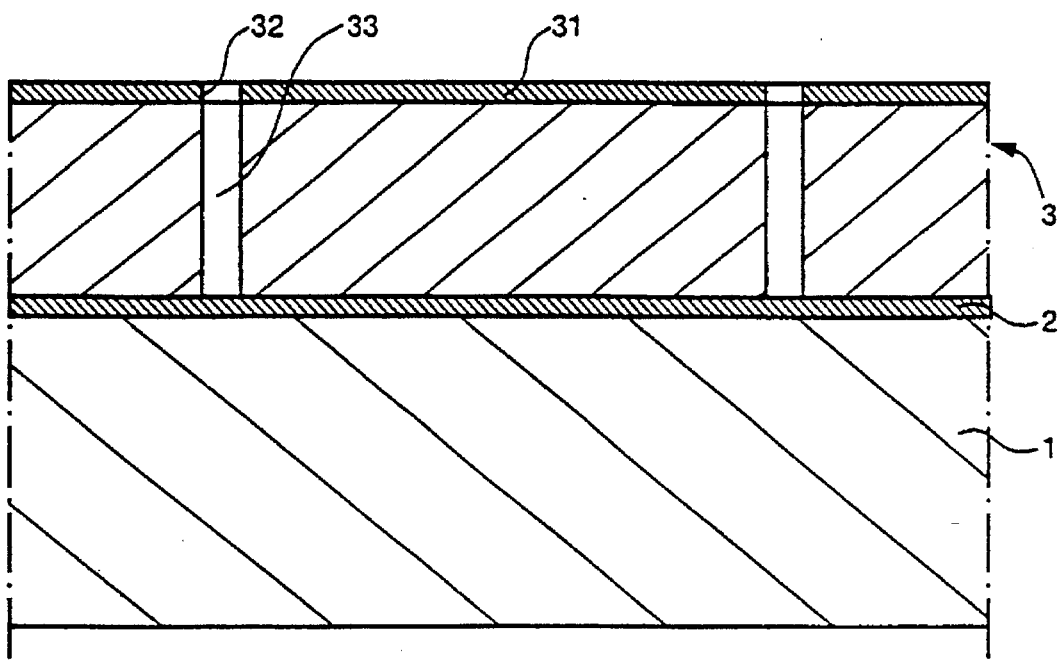
FIGS. 11 to 14 are cross-sectional views illustrating the different stages of manufacture of the transistors shown in FIG. 1.
Figure 12:
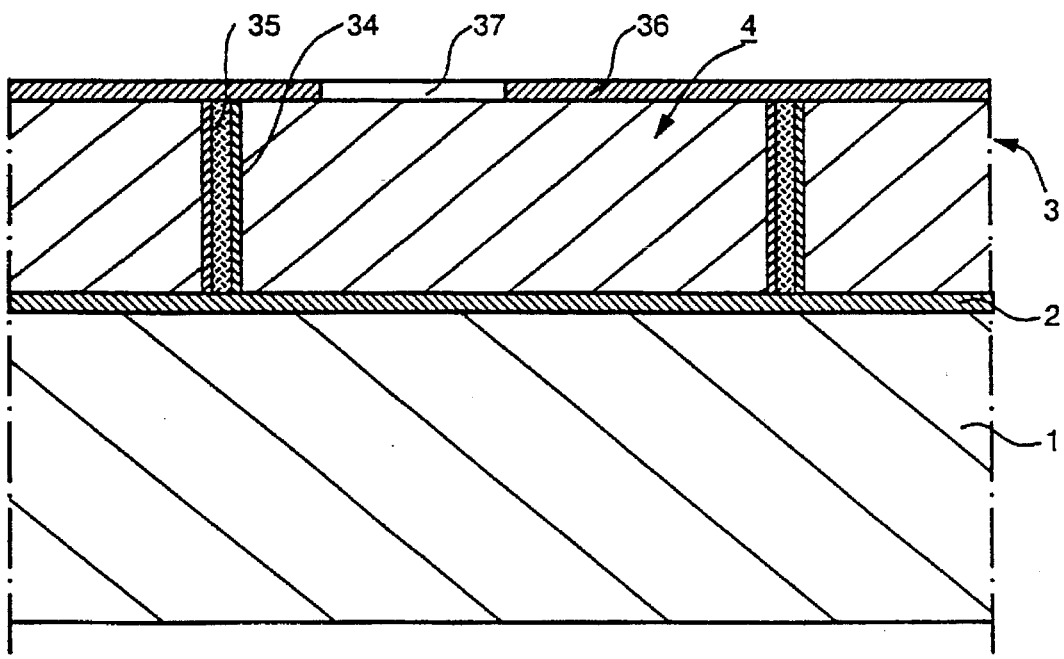
Figure 13:
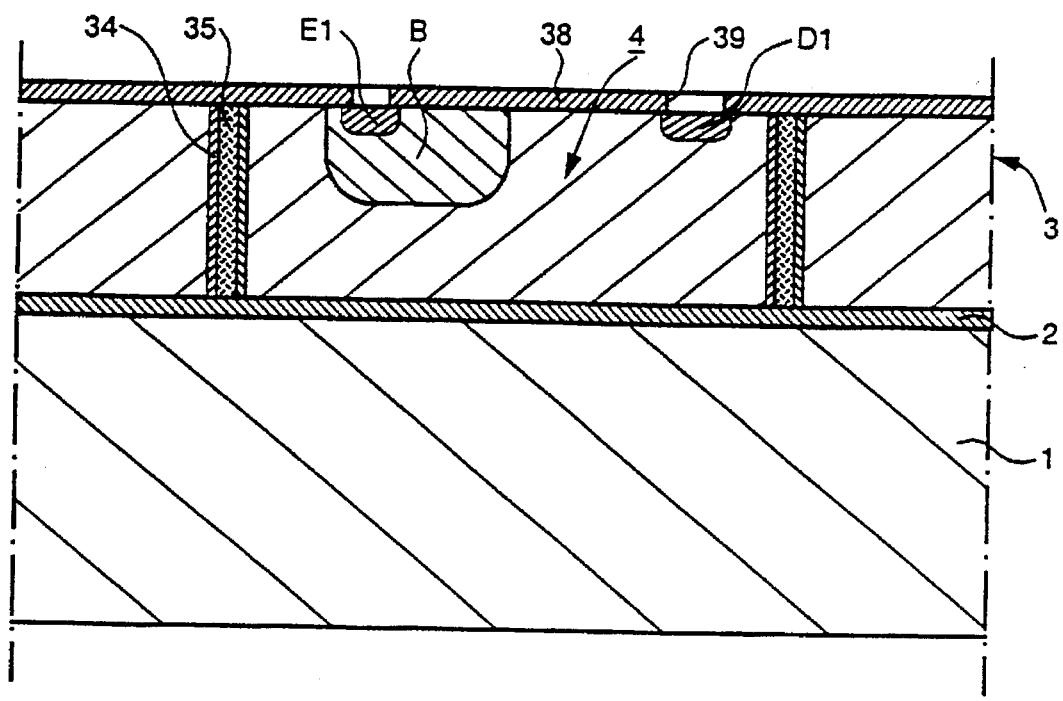
Figure 14:
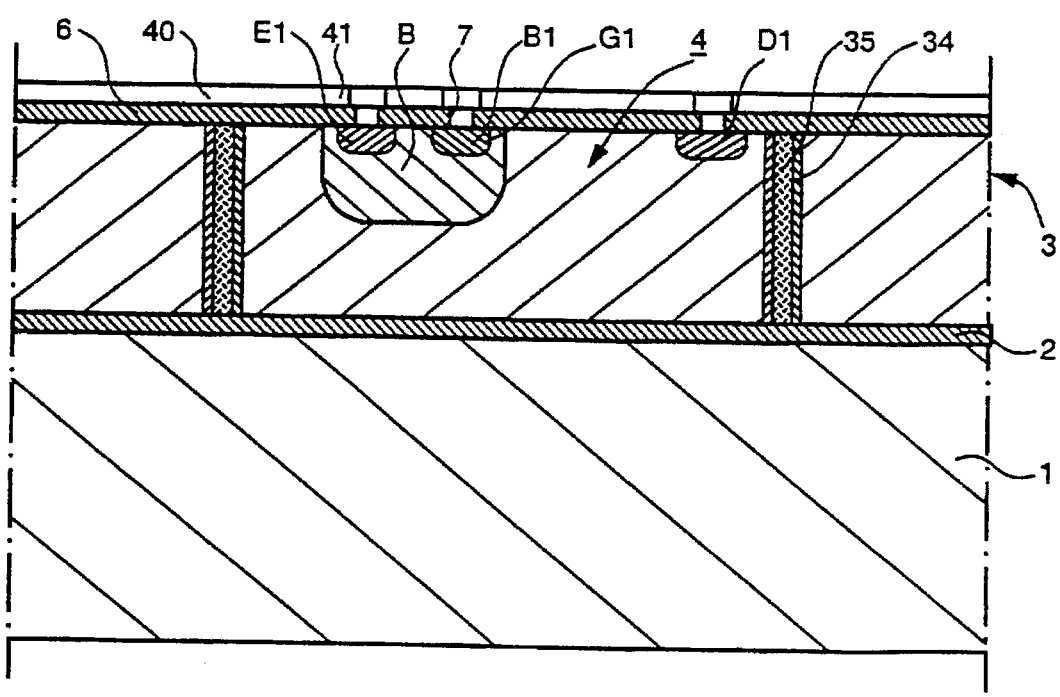

The manner in which the aforesaid components are produced will now be described briefly with reference to FIGS. 11-14. The starting material is a so-called bonded wafer, comprising the silicon substrate 1, the isolating oxide layer 2 and the monocrystalline silicon wafer 3, as illustrated in FIG. 11. Such a bonded wafer may be produced, for instance, in the manner described in the aforecited European Patent Application No. A1-0,418,737 and is available commercially. The upper surface of the wafer 3 is coated with a photoresist layer 31, which is exposed in a predetermined pattern and developed to produce openings 32 in the layer 31. Deep trenches 33 are plasma etched through these openings, down to the isolating layer 2, and the photoresist layer 31 is removed. The sides of the trenches are oxidized to form silicon dioxide layers 34, and the remainders of the trenches 33 are filled with polycrystalline silicon 35, as shown in FIG. 12. The component region 4 is delimited in this way. The wafer 3 is coated with a new photoresist mask 36 having an opening 37. Doping with positive doping material is effected through this opening, so as to obtain the base region B according to FIG. 13. The mask 36 is removed and a further photoresist mask 38 is applied, this mask having openings 39 for negative doping of the emitter E1 and the drain connection D1. The mask 38 is removed and a new photoresist mask is applied and the base connection B1 is heavily and positively doped through the mask. This stage of manufacture has not been shown in the Figure. This latter photoresist mask is removed and the surface of the wafer 3 is oxidized to form the isolating silicon dioxide layer 6, as illustrated in FIG. 14. This layer 6 is coated with a mask 40 having openings 41 through which the connection openings 7 are etched in the layer 6. The mask 40 is removed and the component is provided with external connections and protective layers, not shown in the drawings.

In the foregoing, the bipolar transistor BIP1 has been described connected in series with the field effect transistor JFET1, and a method of producing these transistors. The base region B3 of the transistors BIP2 and JFET2 and the projections G3 of said base region can be produced simply by changing the configuration of the opening 37 in the mask 36. The illustrated bipolar transistors BIP1 and BIP2 are NPN transistors, although it will be understood that the scope of the invention also embraces PNP transistors.

It was mentioned in the introduction that large field strengths may also occur in components intended for calculating or computing circuits that are connected to voltages in the order of 3 to 5 volts. These components are extremely fast and contain high concentrations of doping substances and are small in size. For instance, these components have a thickness, corresponding to the distance A1 in FIG. 1, in the order of only about 0.5 μm. The invention can also be applied to these components, which have a high connecting voltage in relation to their size. It can be mentioned that in the case of these thin components, the aforesaid separation layer 5 can be replaced by a layer produced by so-called local oxidization (LOCOS), which is a relatively simple isolation procedure.

Although the invention has been exemplified with silicon components, it will be understood that other semiconductor materials, such as germanium or gallium arsenide, may be used equally as well.

Figure 15:
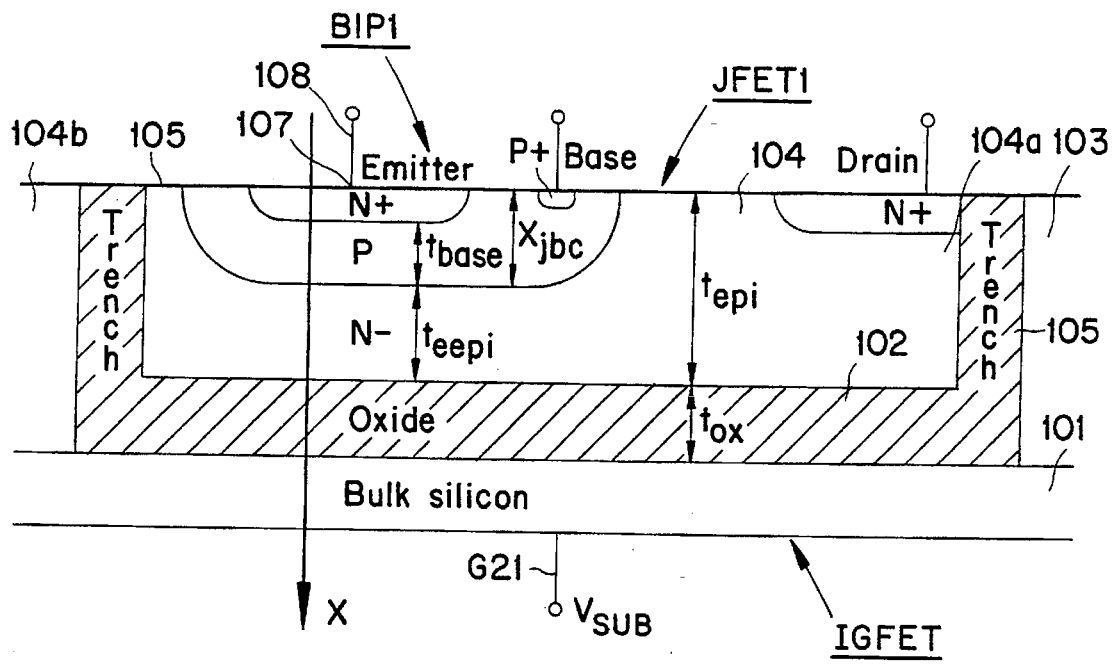
FIG. 15 is a cross sectional view of a bipolar transistor, a field effect transistor, and an isolated gate field effect transistor.

According to one embodiment of the present invention, a gate of an additional isolated gate field effect transistor (IGFET) can be formed by using a proper material under a dielectric material as illustrated in FIG. 15. FIG. 15 is a cross-sectional view of a bipolar transistor BIP1, a junction field effect transistor JFET1, and an isolated gate field effect transistor IGFET. A semi-conductor substrate 101, in this case a silicon substrate, has an upper surface which is oxidized to form an electrically isolating silicon dioxide layer 102. A relatively thin wafer 103 of monocrystalline silicon mounted on the upper layer 102, this wafer being the active layer of the transistor device BIP1 and JFET1. The active layer has a relatively low concentration of negative charge carriers, reference in FIG. 15. A component region 104 is delimited against surrounding parts 104a and 104b in the wafer 103, by means of a separation layer 105 comprised of silicon dioxide and polycrystalline silicon. Separation layer 105 extends from the surface of the monocrystalline wafer 103 down to the isolating layer 102 and fully surrounds the transistors BIP1 and JEFT1. The component region 104 is thereby totally isolated electrically from the substrate 101 and the surrounding parts 104a and 104b of the monocrystalline wafer 103.

The transistor BIP1 has a base region B which is doped with positive charge carriers referenced P in FIG. 15. The base B has a connection region B1 for coaction with an external electrical connection, this connection region being heavily doped $p^+$ with positive charge carriers. Base region B of the transistor BIP1 includes an emitter E1 which is heavily doped $n^+$ with negative charge carriers. A collector region K1 of the transistor BIP1 is also located in the component region 104. A gate connection G1 of the transistor JFET1 is common with the base connection B1 and a source region S1 of the transistor is common with the collector region K1 of the transistor BIP1. A heavily $n^+$ doped region D1 forms a drain connection of the transistor JFET1.

The component region 104 is covered by silicon dioxide isolating layer [106], which is provided with openings 107 for external electrical connections 108. These connections are connected to respective connection regions B1 of the base, the emitter E1 and the drain region D1. The configuration of such external electrical connections is well known and the connections have not be shown in detail in FIG. 15, so as not to complicate the Figure unnecessarily.

According to the present invention, an isolated gate field effect transistor IGFET is formed on the top layer of the bulk silicon layer 101 wherein the layer forms a gate G21 of the transistor IGFET. By applying a proper voltage bias $V_{sub}$ to the gate G21, electric properties of the cascade device can be widely varied as will be described below. The IGFET underlies the whole transistor structure. Furthermore, additional gates may be formed on the sidewalls of the structure, that are separated from the bottom gate in which may be biased differently from the bottom gate thus further improving the electric properties of the present invention.

Figure 16:
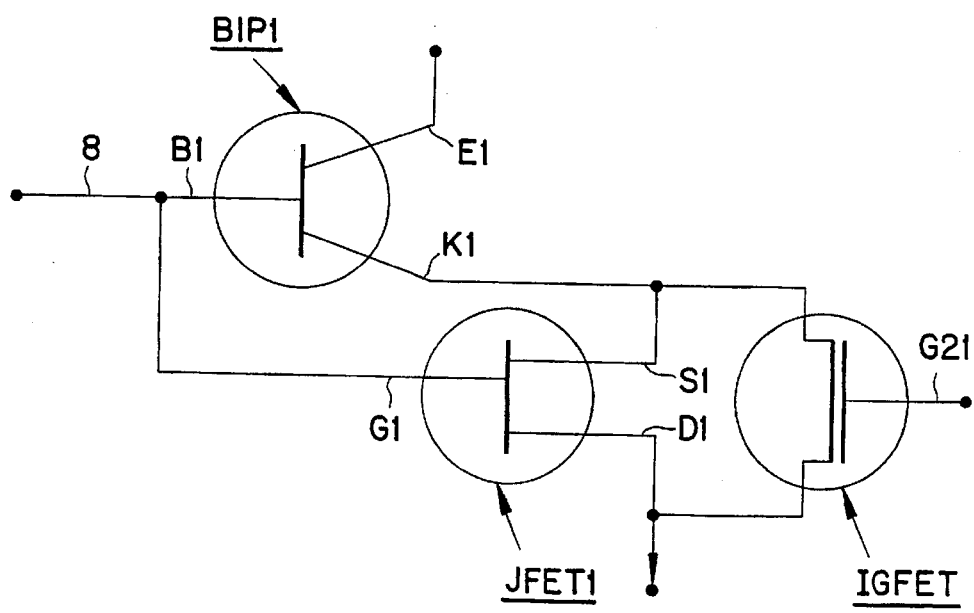
FIG. 16 is a schematic illustration of the transistor in FIG. 15.

FIG. 16 is a schematic illustration of the series connected transistors BIP1 and JFET1 and IGFET. Base connection B1 is connected to the gate connection G1 and the collector K1 is connected to the source region S1. The IGFET is connected to the drain region D1 and the source region S1 so as to be in parallel with the JFET1 and in a cascode configuration with the bipolar transistor. The base connection B1, the emitter E1, the drain connection D1, and the gate connection G21 each have external connections 8.

Figure 17:
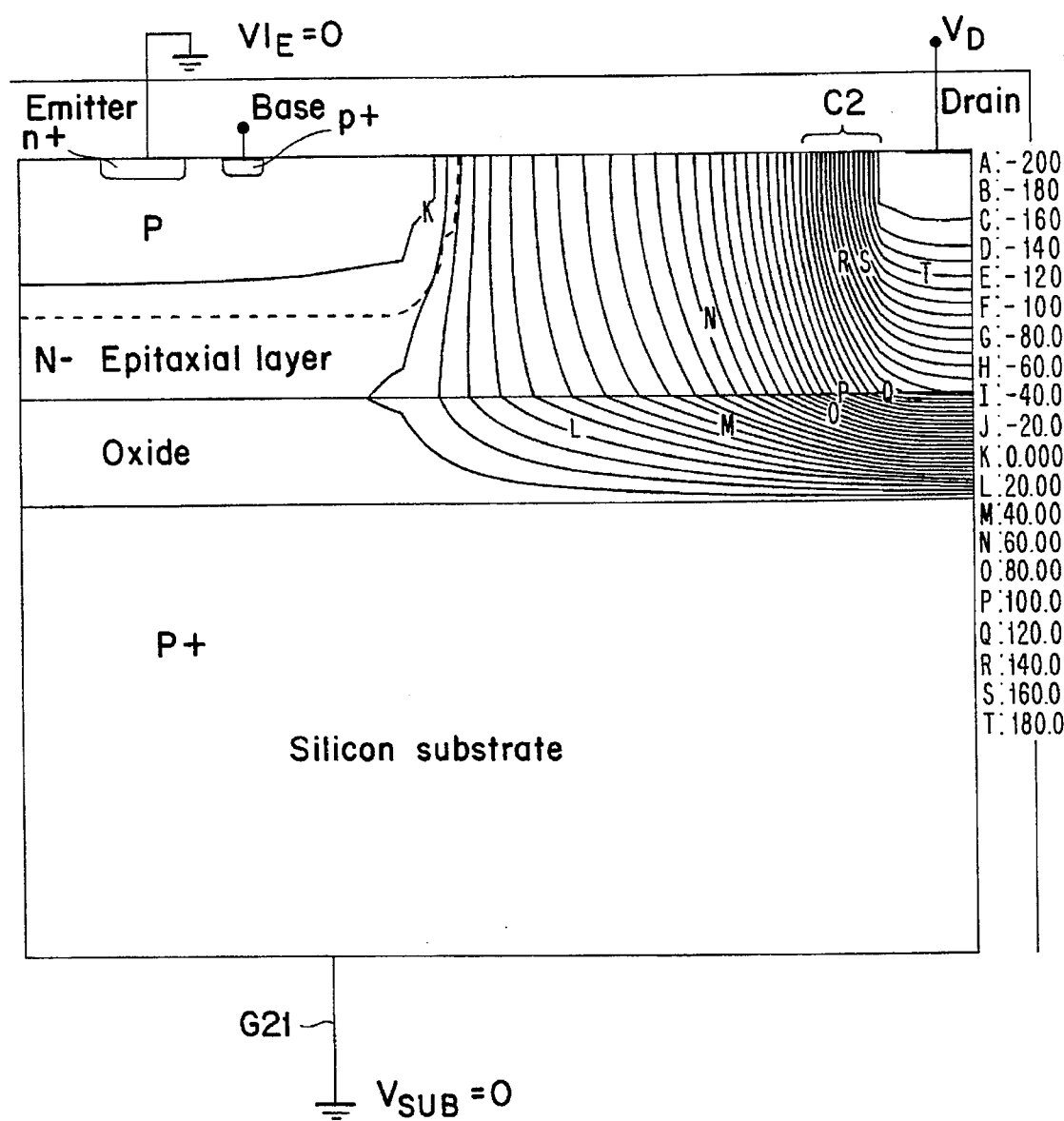
FIG. 17 illustrates equipotential contours for low substrate voltage.
Figure 18:
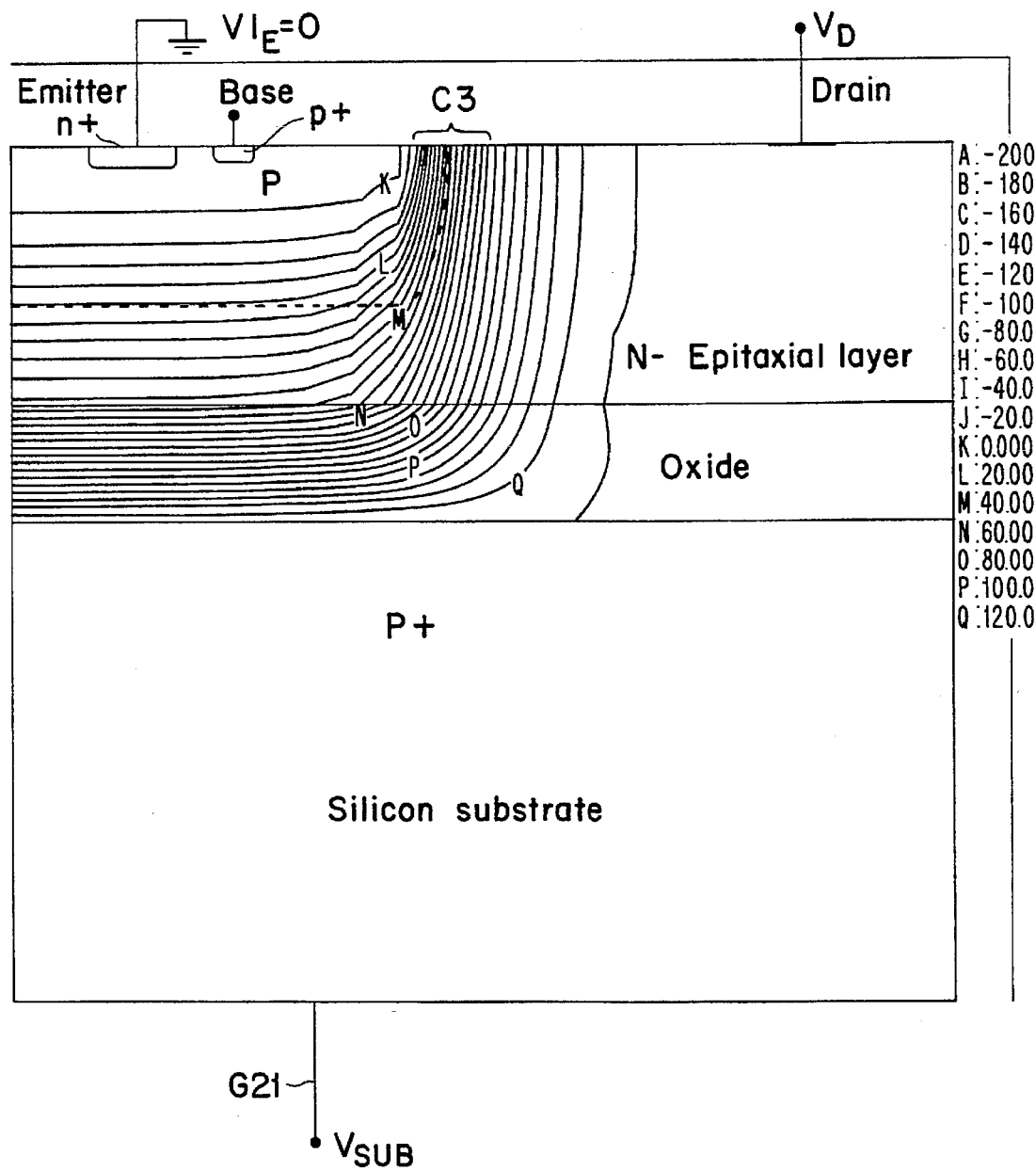
FIG. 18 illustrates equipotential contours for high substrate voltage.

The application of voltage bias $V_{sub}$ to the bottom gate G21 will redistribute the electric field in the device. Two extreme cases are illustrated in FIGS. 17 and 18 in which FIG. 17 illustrates equipotential contours for a low substrate voltage and FIG. 18 illustrates equipotential contours for a high substrate voltage. In FIG. 17, the emitter of the bipolar transistor and the bottom gate G21 are grounded while drain is at a high voltage, e.g., VD=190 volts, wherein the highest field is formed at the drain contact, region C2. A breakdown occurs at the drain contact D1 and is limited by the drain to base breakdown. In FIG. 18, the drain D1 and bottom gate G21 are connected to the same high positive bias $V_{sub}$=VD= 120 volts, while the emitter of the bipolar transistor is grounded, wherein the highest electric field is formed at the edge of the base region C3. The strongly one dimensional voltage distribution should be noted below the emitter where the voltage lock takes place. In this example, the limitation is the collector to emitter breakdown voltage. Applying a proper voltage $V_{sub}$ to the bottom gate will redistribute the electric field evenly between the base edge and the drain contact, thus making it possible to achieve even higher breakdown voltages than in other prior art systems.

Figure 19A:
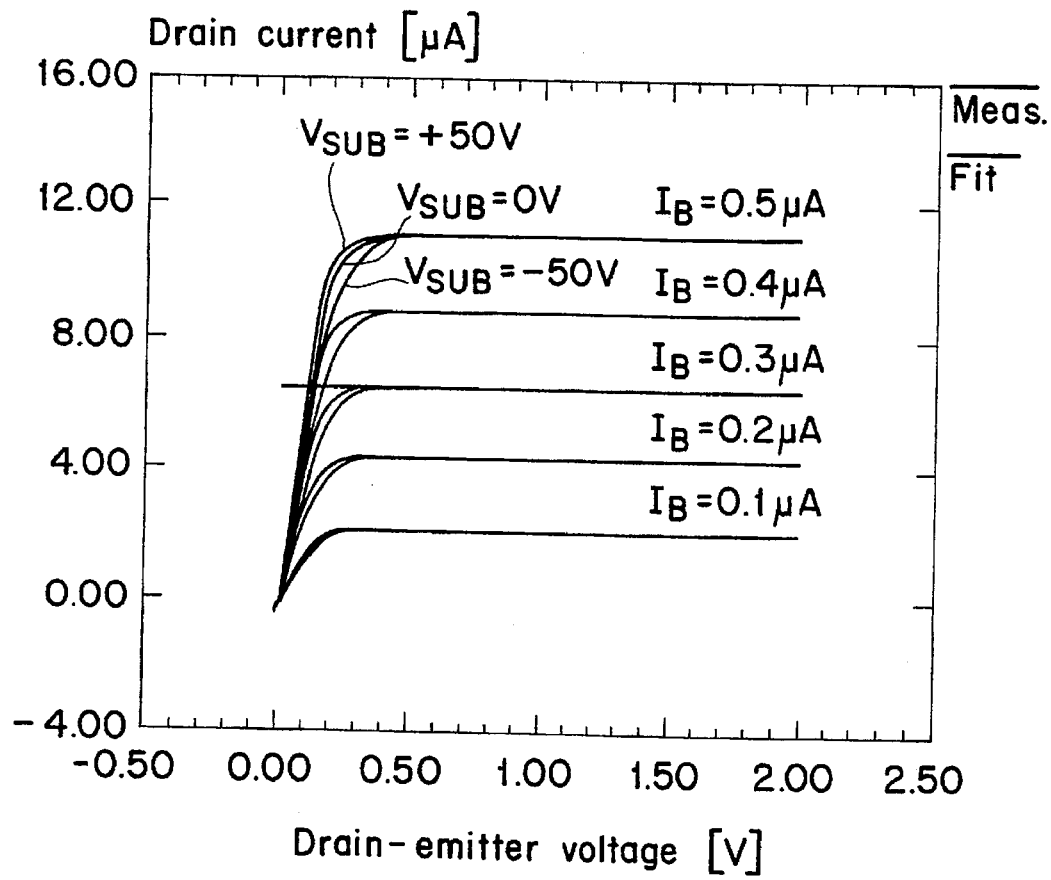
FIG. 19($a$) illustrates a current-voltage characteristic of the transistor device in FIG. 15.
Figure 19B:
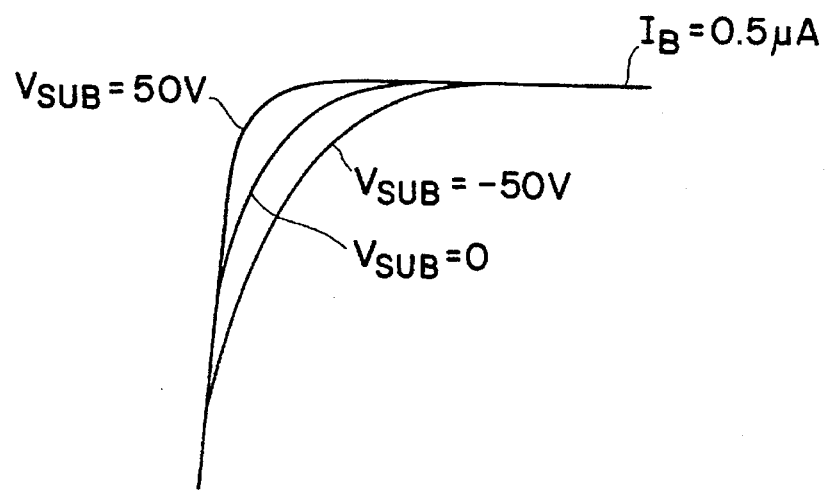
Figure 20:
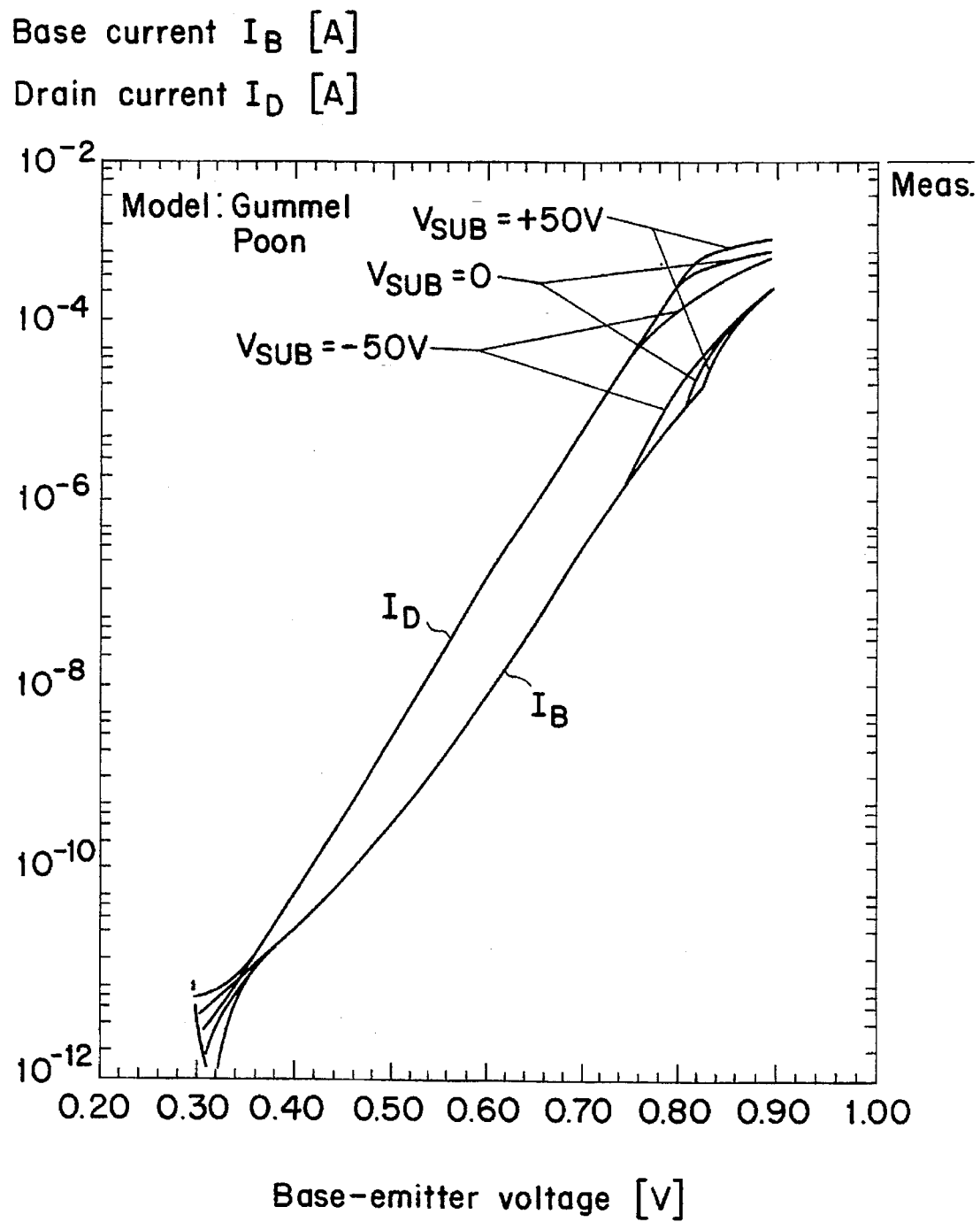
FIG. 20 illustrates comparison curves relating to a known transistor and a transistor according to one embodiment of the present invention.
Figure 21A:
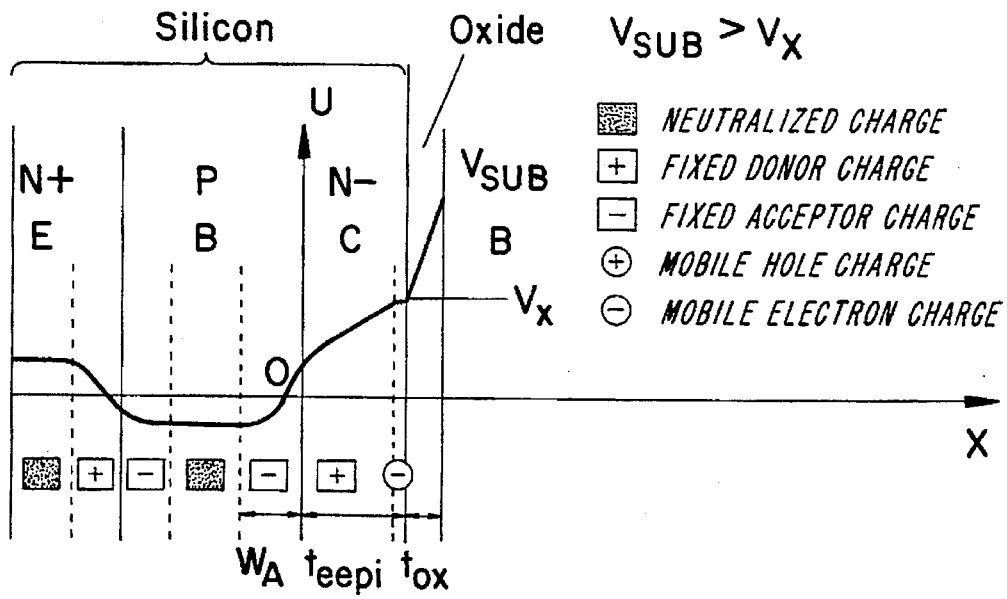
FIGS. 21($a$)–($b$) illustrate internal voltage distribution in the transistor illustrated in FIG. 15.
Figure 21B:
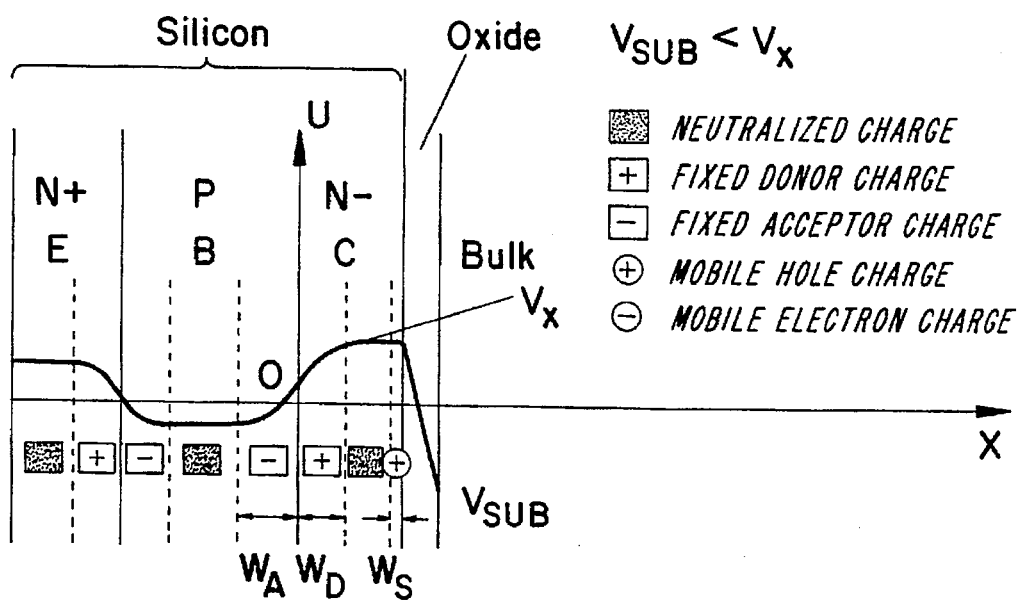

Since the IGFET underlies the whole structure, it effects the series resistance of the device. The IGFET can create an accumulation layer at the lower collector boundary of the dielectric layer and decrease the series resistance as illustrated in FIG. 19. In FIGS. 19(a)–(b), the drain-current versus drain emitter voltage for different substrate voltages $V_{sub}$ and base currents measured on fabricated devices is illustrated. Also, the high current capability of the device can be improved in this manner as illustrated in FIG. 20 which illustrates a Gummel plot for different substrate voltages $V_{sub}$ measured on a fabricated 1500 µm² bipolar transistor. Thus, application of a specific voltage bias $V_{sub}$ to the gate G21 will create an accumulation or depletion layer at the collector K1 to dielectric interface to achieve the desired device electrical properties. A model of the behavior of the device is shown in FIGS. 21(a)–(b) which illustrates the internal voltage distribution and important charges along the X axis of FIG. 15. The doping profiles are approximated by constant values in the different regions. FIG. 21a illustrates the accumulation case with high substrate bias wherein $V_{sub}$ is greater than Vx and FIG. 21b illustrates the inversion case with low substrate bias, wherein $V_{sub}$ is less than Vx. The voltage Vx denominates the drain voltage at which the potential under the base is locked due to the fact that all mobile electron charge in the accumulation or charge neutral epilayer disappears and the drain contact is no longer connected through a low resistance path.

Figure 22:
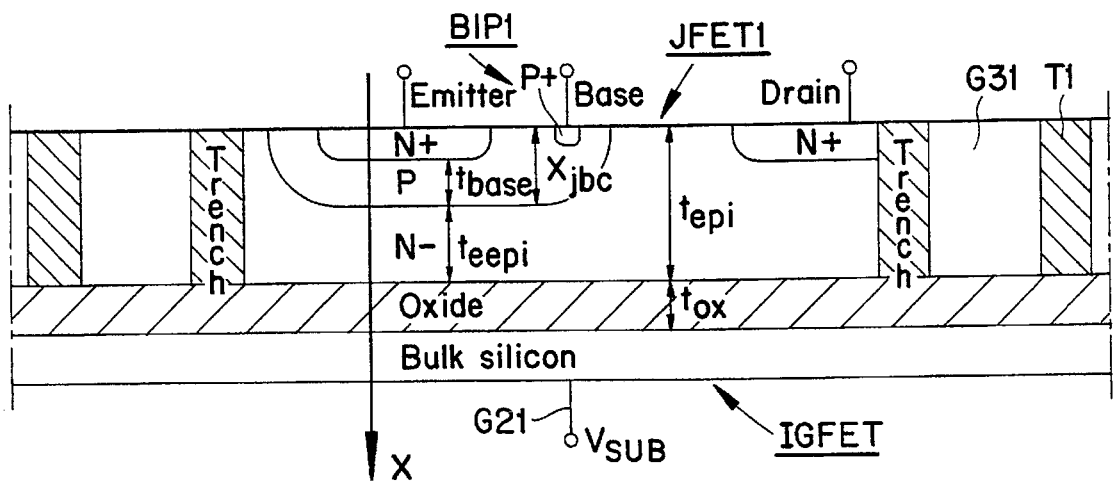
FIG. 22 illustrate a cross-sectional view of transistors according to one embodiment of the present invention.
Figure 23:
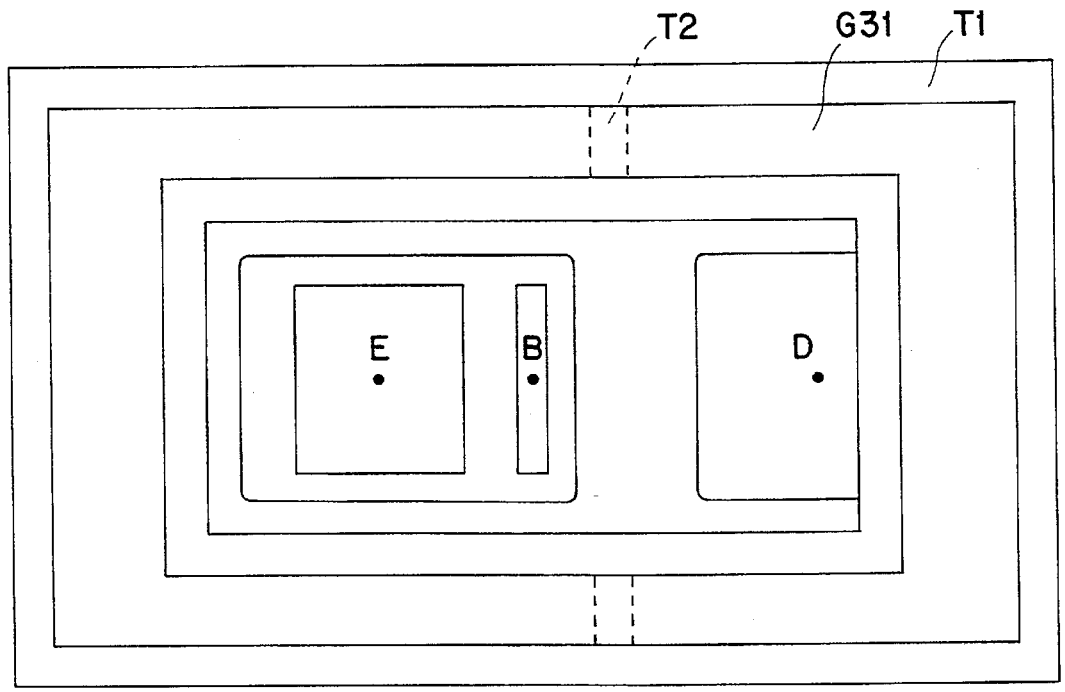
FIG. 23 is a view of the transistor in FIG. 22 from above.

Sidewall gates may further improve the properties of the semiconductor device in the above described way by taking care of three dimensional effects that normally degrade the device property. FIGS. 22 and 23 show one embodiment of the present invention in which a sidewall gate G31 surrounds the BIP1 and JFET1 device. The sidewall gate G31 is in turn surrounded by a trench T1 of silicon dioxide. According to the alternative of the present invention, the gate G31 is divided into two separated sidewall gates by a trench T2. The three dimensional field distribution at the vertical edges of the BIP1, JFET1 device normally degrade the breakdown voltage of the device. This field distribution can be redistributed by applying a suitable voltage to the sidewall gates G31 to give the lowest possible field strength at the edges and thus increase the breakdown voltage.

One disadvantage with using the monocrystalline substrate as a backside gate is that all devices on one IC chip are effected simultaneously by the same $V_{sub}$. By using wafer bonding techniques, it is possible to insert an isolated silicon layer so as to isolate the bottom gate areas from each other using either LOCOS or trench isolation techniques. As a result, the different devices can be individually controlled. FIG. 24 illustrates a section of one embodiment of the present invention wherein the bottom gate G21 is isolated. A silicon substrate 200 has an upper surface with an oxide layer 201. On top of the oxide layer there is a silicon wafer 202. The bottom gate G21 is formed in the wafer 202 by trenches T3. The wafer 202 has an upper surface with an oxide layer 203, on which a second silicon wafer 204 is placed. The BIP1-JFET1 device is formed in this second wafer 204 and the gate G21 underlies the entire device. The gate G21 is electrically connected via a trench 205. The device illustrated in FIG. 24 is manufactured by oxidizing the upper surface of substrate 200 and fastening the wafer 202 to the oxide layer 201 by wafer bonding as described above. The trenches T3 are formed by plasma etching, oxidizing the trench and filling it with polysilicon. The surface of the wafer 202 is oxidized to the silicon layer 203 and the second wafer 204 is wafer bonded to the layer 203. The trenches surrounding the BIP1-JFET1 device and also the trench 205 are made by plasma etching. The trench 205 goes through the oxide layer 203. As described above, the walls of the trenches are oxidized with silicon dioxide and the trench is then filled with polycrystalline silicon. The polysilicon is heavily doped and makes good electrical contact with the gate layer G21.

The inventive components provide several advantages in addition to their voltage durability. By applying the resurf technique in the aforedescribed manner, the applied voltage is distributed over a large part of the component. Consequently, the component need only occupy a relatively small surface area of the substrate, as described above. In addition, the components may advantageously be made thin, which enables the components to be isolated laterally with the illustrated dielectrical separation layers 5 and 205 respectively. This results in a further reduction in the space required on the substrate. When practicing the invention, the requisite surface area of a semiconductor substrate which is to carry a specific number of components can be at least halved in comparison with earlier known techniques. This is particularly beneficial in the case of, for instance, subscriber line circuits in a telephone system in which each subscriber has its own line circuit. Another advantage afforded by the invention is that the components can be produced easily, since they are formed in a finished monocrystalline semiconductor layer and since their form is determined by selection of photoresist masks.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A semiconductor device in a thin active layer with high breakdown voltage and having charge carrier depleted regions of reduced electrical field strength comprising:

a substrate;

a component region of a semiconductor material carried by the substrate and having an upper surface and a lower surface and being weakly doped with a first type of doping material;

a dielectric isolating layer delimiting the lower surface of the component region from the substrate;

a separation layer extending along from, back, left and right surfaces of the component region;

in the component region, a bipolar transistor which is connected in series to a field effect transistor;

a base region of the bipolar transistor in the component region that has a relatively low concentration of a second type of doping material which is opposite to the first type of doping material and that extends from the upper surface of the component region;

a PN-junction at a bottom surface of the base region bordering a part of the component region; and a plurality of electrical connections, wherein when electrical voltages are applied to the electrical connections the regions of reduced electrical field strength are depleted of charge carriers, a first one of the charge carrier depleted regions extending from the PN-junction to the dielectric isolating layer, at least beneath a part of the base region;

wherein the base region surrounds an emitter region of the bipolar transistor which is heavily doped with the first type of doping material and which is connected to a first one of the electrical connections;

the base region has a base connection region which is heavily doped with the second type of doping material and which is connected to a second one of the electrical connections;

the base connection region includes a gate connection region for the field effect transistor;

a collector region of the bipolar transistor and a source region of the field effect transistor are provided in the component region; and the field effect transistor has a drain connection region that is heavily doped with the first type of doping material and that is connected to a third one of the electrical connections, such that when electrical voltages are applied to the first, second, and third electrical connections, an electrical field strength in the first charge carrier depleted region is less than a breakdown field strength of the semiconductor device; and wherein the separation layer has dielectric isolating walls on the front and back surfaces of the component region;

two projections extend from the base region in the component region along the front and back surfaces; and a second one of the charge carrier depleted regions extends between the projections.

2. The semiconductor device according to claim 1, wherein ends of the projections proximate to the base region have cross-section widths that are greater than cross-section widths of other ends of the projections.

3. A semiconductor device in a thin active layer with high breakdown voltage and having charge carrier depleted regions of reduced electrical field strength comprising:

a substrate;

a component region of a semiconductor material carried by the substrate and having an upper surface and a lower surface and being weakly doped with a first type of doping material;

a dielectric isolating layer delimiting the lower surface of the component region from the substrate;

a separation layer extending along front, back, left and right surfaces of the component region;

in the component region, a bipolar transistor which is connected in series to a first field effect transistor;

a base region of the bipolar transistor in the component region that has a relatively low concentration of a second type of doping material which is opposite to the first type of doping material and that extends from the upper surface of the component region;

a PN-junction at a bottom surface of the base region bordering a part of the component region; and a plurality of electrical connections in the component region, wherein when electrical voltages are applied to the electrical connections the regions of reduced electrical field strength are depleted of charge carriers, a first one of the charge carrier depleted regions extending from the PN-junction to the dielectric isolating layer, at least beneath a part of the base region;

wherein the base region surrounds an emitter region of the bipolar transistor which is heavily doped with the first type of doping material and which is connected to a first one of the electrical connections;

the base region has a base connection region which is heavily doped with the second type of doping material and which is connected to a second one of the electrical connections;

the base connection region includes a gate connection region for the first field effect transistor;

a collector region of the bipolar transistor and a source region of the first field effect transistor are provided in the component region;

the first field effect transistor has a drain connection region that is heavily doped with the first type of doping material and that is connected to a third one of the electrical connections, such that when electrical voltages are applied to the first, second, and third electrical connections, an electrical field strength in the first charge carrier depleted region is less than a breakdown field strength of the semiconductor device; and a second field effect transistor connected in parallel to said first field effect transistor has a gate connected to a fourth one of the electrical connections, such that when an electrical voltage is applied to the fourth electrical connection the electric field of the semiconductor device is redistributed; and wherein the separation layer has dielectric isolating walls on the front and back surfaces of the component region;

two projections extend from the base region in the component region along the front and back surfaces; and a second one of the charge carrier depleted regions extends between the projections.

4. The semiconductor device according to claim 3, wherein the gate of the second field effect transistor underlies the component region.

5. The semiconductor device according to claim 3, wherein ends of the projections proximate to the base region have cross-section widths that are greater than cross-section widths of other ends of the projections.

* * * * *